United States Patent
Kim

(10) Patent No.: US 10,902,898 B2
(45) Date of Patent: Jan. 26, 2021

(54) DECODING CIRCUIT TO SELECT A COLUMN SELECT LINE CORRESPONDING TO AN ADDRESS SIGNAL AND SEMICONDUCTOR MEMORY DEVICE HAVING THE SAME

(71) Applicant: SK hynix Inc., Gyeonggi-do (KR)

(72) Inventor: Sang Hwan Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/503,739

(22) Filed: Jul. 5, 2019

(65) Prior Publication Data

US 2020/0143861 A1    May 7, 2020

(30) Foreign Application Priority Data

Nov. 5, 2018 (KR) .......................... 10-2018-0134684

(51) Int. Cl.
| | | |
|---|---|---|
| *G11C 8/10* | (2006.01) | |
| *G11C 8/18* | (2006.01) | |
| *G11C 8/06* | (2006.01) | |
| *G06F 12/02* | (2006.01) | |
| *G11C 7/12* | (2006.01) | |
| *G11C 7/22* | (2006.01) | |
| *G06F 12/0888* | (2016.01) | |
| *G11C 29/44* | (2006.01) | |

(52) U.S. Cl.
CPC ............ *G11C 8/10* (2013.01); *G06F 12/0246* (2013.01); *G06F 12/0888* (2013.01); *G11C 7/12* (2013.01); *G11C 7/222* (2013.01); *G11C 8/06* (2013.01); *G11C 8/18* (2013.01); *G11C 29/4401* (2013.01)

(58) Field of Classification Search
CPC .... G11C 8/10; G11C 8/18; G11C 8/06; G11C 7/12; G11C 7/222; G11C 29/4401; G11C 29/76; G06F 12/0246; G06F 12/0888
See application file for complete search history.

(56) References Cited

U.S. PATENT DOCUMENTS

| | | | |
|---|---|---|---|
| 8,854,906 B2* | 10/2014 | Cho ....................... | G11C 29/84 365/200 |
| 2013/0201767 A1* | 8/2013 | Kim ....................... | G11C 8/00 365/189.05 |

FOREIGN PATENT DOCUMENTS

KR    10-2016-0044850    4/2016

* cited by examiner

*Primary Examiner* — David Lam
(74) *Attorney, Agent, or Firm* — IP & T Group LLP

(57) ABSTRACT

A semiconductor memory device includes a memory cell array, a buffer unit, control logic, and a decoding circuit. The memory cell array includes a plurality of memory cells. The buffer coupled to the memory cell array, and includes a first memory area, a second memory area, and a conversion memory area. The control logic outputs a mode control signal representing an operating mode of the buffer. The decoding circuit controls the operating mode of the buffer such that the conversion memory area operates as any one of a main memory area and a repair memory area, based on the mode control signal.

15 Claims, 22 Drawing Sheets

DECODING CIRCUIT TO SELECT A COLUMN SELECT LINE CORRESPONDING TO AN ADDRESS SIGNAL AND SEMICONDUCTOR MEMORY DEVICE HAVING THE SAME

CROSS-REFERENCE TO RELATED APPLICATION

The present application claims priority under 35 U.S.C. § 119(a) to Korean patent application number 10-2018-0134684, filed on Nov. 5, 2018, which is incorporated by reference in its entirety.

BACKGROUND

1. Field of Invention

The present disclosure generally relates to an electronic device, and more particularly, to a decoding circuit and a semiconductor memory device having the same.

2. Description of Related Art

Semiconductor memory devices may be formed in a two-dimensional (2D) structure in which strings are arranged horizontally to a semiconductor substrate, or may be formed in a three-dimensional (3D) structure in which strings are arranged vertically to a semiconductor substrate. A 3D semiconductor memory device was devised to overcome the limit of degree of integration in 2D semiconductor memory devices. A 3D semiconductor memory device may include a plurality of memory cells vertically stacked on a semiconductor substrate.

SUMMARY

Embodiments provide a decoding circuit capable of flexibly using a partial area of a cache buffer and a semiconductor memory device having the decoding circuit.

In accordance with an aspect of the present disclosure, there is provided a semiconductor memory device including: a memory cell array including a plurality of memory cells; a buffer coupled to the memory cell array, including a first memory area, a second memory area, and a conversion memory area; control logic configured to output a mode control signal representing an operating mode of the buffer; and a decoding circuit configured to control the operating mode of the buffer such that the conversion memory area operates as any one of a main memory area and a repair memory area, based on the mode control signal.

When the mode control signal indicates a first mode, the decoding circuit may control the operating mode of the buffer such that the first memory area and the conversion memory area are used as the main memory area and the second memory area is used as the repair memory area.

When the mode control signal indicates a second mode, the decoding circuit may control the operating mode of the buffer such that the first memory area is used as the main memory area and the second memory area and the conversion memory area are used as the repair memory area.

The decoding circuit may include: a column address generator configured to generate an address signal, based on the mode control signal; and a column decoder coupled to the buffer unit through column select lines, and configured to decode the column select lines, based on the address signal.

The column select lines may include first column select lines coupled to the first memory area, second column select lines coupled to the second memory area, and conversion column select lines coupled to the conversion memory area.

The column decoder may include: a signal inverter configured to generate an inverting address signal by inverting the address signal; a select signal generator configured to generate a select signal by decoding the address signal and the inverting address signal; and a clock synchronizer configured to generate a column select signal for selecting the column select lines by synchronizing the select signal with a clock signal.

The column address generator may include: a main address generator configured to generate a main address signal sequentially increased according to a clock signal; a repair register configured to store repair information; a repair address generator configured to generate a repair address signal, based on the repair information; a repair enable determiner configured to generate a repair enable signal, based on the repair information; and a multiplexer configured to output one of the main address signal and the repair address signal as the address signal, based on the repair enable signal.

The main address generator may include: a count enable signal generator configured to generate a count enable signal for determining an end value of the main address signal, based on the mode control signal; and a column counter configured to generate the main address signal sequentially increased from an initial value to the end value, based on the count enable signal.

The count enable signal generator may include: a count end control signal generator configured to generate a count reference signal by selecting one of a first count value and a second count value, based on the mode control signal; and a logical product operator configured to generate the count enable signal by performing a logical product operation on a bit value included in the count reference signal.

The buffer may include a page buffer.

The buffer may include a cache buffer.

In accordance with another aspect of the present disclosure, there is provided a decoding circuit including: a column decoder coupled to column selection lines including main column select lines, conversion column select lines, and repair column select lines, to select a column select line corresponding to an address signal; and a column address generator configured to generate the address signal such that a conversion memory area coupled to the conversion column select lines operates as one of a main memory area and a repair memory area, based on a mode control signal.

The column decoder may include: a signal inverter configured to generate an inverting address signal by inverting the address signal; a select signal generator configured to generate a select signal by decoding the address signal and the inverting address signal; and a clock synchronizer configured to generate a column select signal for selecting the column select lines by synchronizing the select signal with a clock signal.

The column address generator may include: a main address generator configured to generate a main address signal sequentially increased according to a clock signal; a repair address generator configured to generate a repair address signal, based on repair information; a repair enable determiner configured to generate a repair enable signal, based on the repair information; and a multiplexer configured to output one of the main address signal and the repair address signal as the address signal, based on the repair enable signal.

When the mode control signal indicates a first mode, the main address generator may generate the main address signal for selecting the main column select lines and the conversion column select lines, and the repair address generator may generate the repair address signal for selecting the repair column select lines.

When the mode control signal indicates a second mode, the main address generator may generate the main address signal for selecting the main column select lines, and the repair address generator may generate the repair address signal for selecting the conversion column select lines and the repair column select lines.

The main address generator may include: a count enable signal generator configured to generate a count enable signal for determining an end value of the main address signal, based on the mode control signal; and a column counter configured to generate the main address signal sequentially increased from an initial value to the end value, based on the count enable signal.

The count enable signal generator may include: a count end control signal generator configured to generate a count reference signal by selecting one of a first count value and a second count value, based on the mode control signal; and a logical product operator configured to generate the count enable signal by performing a logical product operation on a bit value included in the count reference signal.

In accordance with another aspect of the present disclosure, there is provided a semiconductor memory device including: a memory cell; a plurality of latches coupled to the memory cell array, the plurality of latches including a first subset of latches, a second subset of latches and a third subset of latches; control logic configured to output a mode control signal indicating operation of the semiconductor device in one of a normal mode and a test mode; and a decoding circuit coupled to the plurality of latches. The decoding unit is configured to receive the mode control signal, employ the first subset of latches and the second subset of latches as main latches and the third subset of latches as repair latches when the mode control signal indicates the normal mode, and employ the first subset of latches as the main latches and the second subset of latches and the third subset of latches as the repair latches when the mode control signal indicates the test mode.

BRIEF DESCRIPTION OF THE DRAWINGS

Various embodiments are described more fully below with reference to the accompanying drawings; however, the present invention may be embodied in different forms and thus should not be construed as limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Throughout the specification, reference to "an embodiment," "another embodiment" or the like is not necessarily to only one embodiment, and different references to any such phrase are not necessarily to the same embodiment(s).

DETAILED DESCRIPTION

Figure 1:
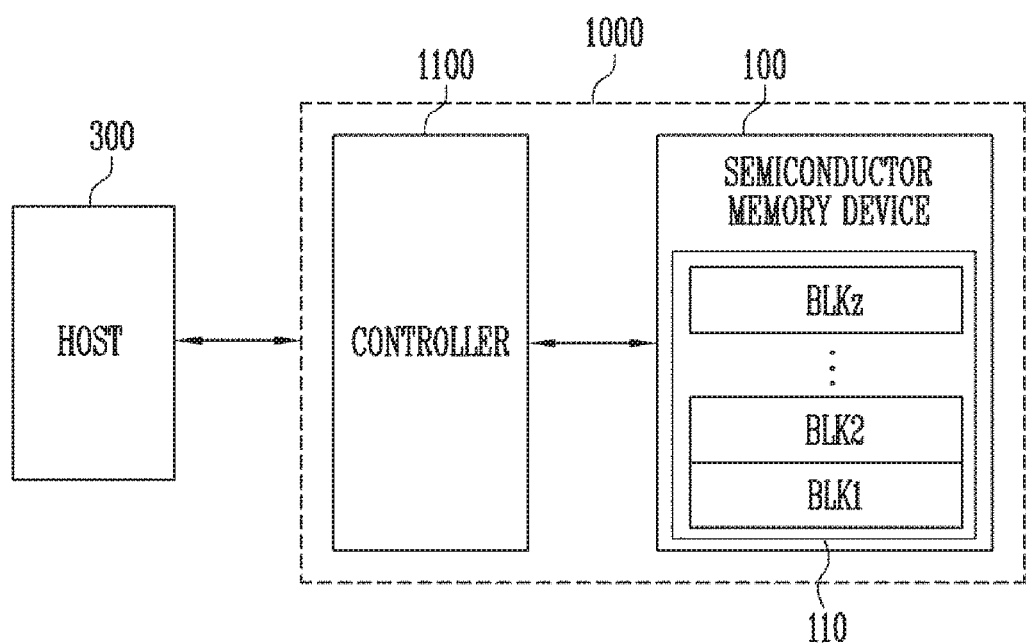
FIG. 1 is a block diagram illustrating a memory system.

In the present disclosure, advantages, features and methods for achieving them will become more apparent after a reading of the following embodiments taken in conjunction with the drawings. The present invention may, however, be embodied in different forms and thus should not be construed as being limited to the embodiments set forth herein. Rather, these embodiments are provided to describe the present disclosure in detail to the extent that those skilled in the art to which the disclosure pertains may easily practice the present invention.

Throughout the specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include one or more additional components instead of excluding such component(s), unless the context indicates otherwise.

Embodiments of the present disclosure are described in detail below with reference to the accompanying drawings. The same reference numerals are used to designate the same elements as those shown in other drawings. In the following description, only that necessary for understanding operations in accordance with the embodiments may be presented; description of well-known technical details may be omitted so as to not obscure important concepts of the embodiments.

FIG. 1 is a block diagram illustrating a memory system 1000.

Referring to FIG. 1, the memory system 1000 may include a semiconductor memory device 100 and a controller 1100. Also, the memory system 1000 communicates with a host 300. The semiconductor memory device 100 includes a memory cell array 110, and the memory cell array 110 includes a plurality of memory blocks BLK1 to BLKz. The controller 1100 controls overall operations of the semiconductor memory device 100. Also, the controller 1100 controls an operation of the semiconductor memory device 100 in response to a command received from the host 300.

Figure 2:
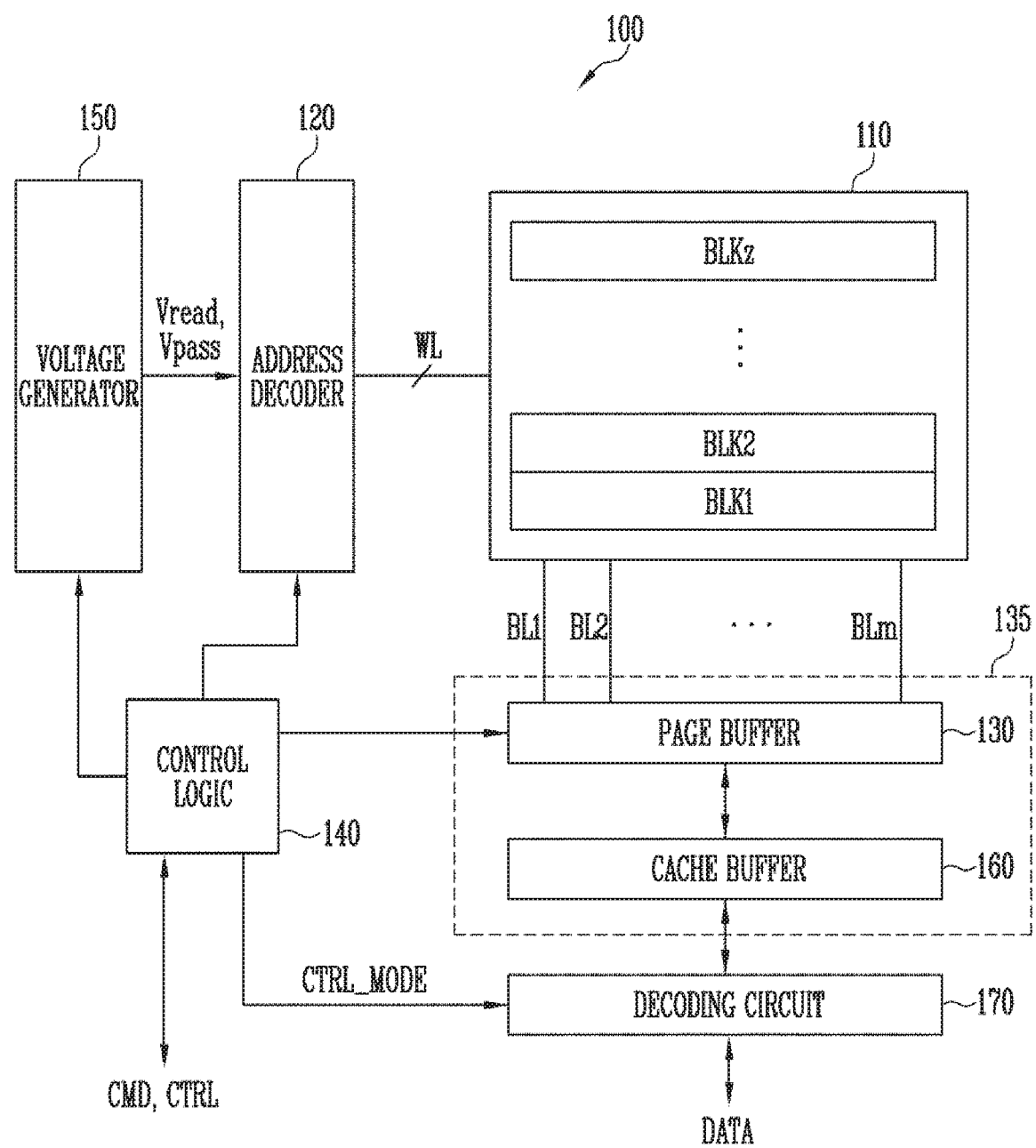
FIG. 2 is a block diagram illustrating a semiconductor memory device in accordance with an embodiment of the present disclosure.

FIG. 2 is a block diagram illustrating a semiconductor memory device 100 in accordance with an embodiment of the present disclosure.

Referring to FIG. 2, the semiconductor memory device 100 includes a memory cell array 110, an address decoder 120, a buffer 135, control logic 140, a voltage generator 150, and a decoding circuit 170. The buffer 135 may be in form of an array and include a page buffer 130 and a cache buffer 160.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the page buffer 130 through bit lines BL1 to BLm. Each of the plurality of memory blocks BLK1 to BLKz includes a plurality of memory cells. In an embodiment, the plurality of memory cells are non-volatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Each of the plurality of memory cells included in the memory cell array 110 may store at least one bit of data. In an embodiment, each of the plurality of memory cells included in the memory cell array 110 may be a single-level cell (SLC) that stores one bit of data. In another embodiment, each of the plurality of memory cells included in the memory cell array 110 may be a multi-level cell (MLC) that stores two bits of data. In still another embodiment, each of the plurality of memory cells included in the memory cell array 110 may be a triple-level cell (TLC) that stores three bits of data. In still another embodiment, each of the plurality of memory cells included in the memory cell array 110 may be a quad-level cell (QLC) that stores four bits of data. In some embodiments, the memory cell array 110 may include a plurality of memory cells that each stores five or more bits of data.

The address decoder 120, the page buffer 130, the voltage generator 150, the cache buffer 160, and the decoding circuit 170 operate as a peripheral circuit that drives the memory cell array 110. The address decoder 120 is coupled to the memory cell array 110 through the word lines WL. The address decoder 120 operates under the control of the control logic 140. The address decoder 120 receives an address through an input and output (input/output) buffer (not shown) provided in the semiconductor memory device 100.

The address decoder 120 decodes a block address in the received address. The address decoder 120 selects at least one memory block according to the decoded block address. In a read voltage application operation during a read operation, the address decoder 120 applies a read voltage Vread generated by the voltage generator 150 to a selected word line among the selected memory blocks, and applies a pass voltage Vpass to unselected word lines. In a program verify operation, the address decoder 120 applies a verify voltage generated by the voltage generator 150 to the selected word line among the selected memory blocks, and applies the pass voltage Vpass to the unselected word lines. The address decoder 120 decodes a column address in the received address.

Read and program operations of the semiconductor memory device 100 are performed in units of pages. An address received in a request of the read operation and the program operation includes a block address, a row address, and a column address. The address decoder 120 selects one memory block and one word line according to the block address and the row address. The address decoder 120 may include a block decoder, a row decoder, a column decoder and an address buffer.

The page buffer 130 of the buffer 135 is coupled to the memory cell array 110 through the bit lines BL1 to BLm. In order to sense a threshold voltage of memory cells in the read operation and the program verify operation, the page buffer 130 senses a change in amount of current flowing depending on a program state of a corresponding memory cell while continuously supplying a sensing current to bit lines coupled to the memory cells, and latches the sensed change as sensing data. The page buffer 130 operates in response to page buffer control signals received from the control logic 140.

The page buffer 130 temporarily stores read data by sensing data of a memory cell for the read operation. The data temporarily stored in the page buffer 130 may be output to the controller 200 through the cache buffer 160 and the decoding circuit 170.

The control logic 140 is coupled to the address decoder 120, the page buffer 130, and the voltage generator 150. Also, the control logic 140 may control operations of the cache buffer 160 and the decoding circuit 170.

The control logic 140 receives a command CMD and a control signal CTRL of the semiconductor memory device 100. The control logic 140 controls the overall operations of the semiconductor memory device 100 in response to the control signal CTRL. In various embodiments, the control logic 140 may control the page buffer 130 and the cache buffer 160 to perform a read operation and a write operation of the memory cell array 110.

The control logic 140 generates a mode control signal CTRL_MODE and transfers the mode control signal CTRL_MODE to the decoding circuit 170. The mode control signal CTRL_MODE is a signal for controlling the decoding circuit 170 to use the buffer 135 in a first mode or a second mode. More specifically, the decoding circuit 170 uses a conversion memory area included in the buffer 135 as a main memory area or a repair memory area in response to the mode control signal CTRL_MODE. That is, the decoding circuit 170 controls an operation of the buffer 135 such that the conversion memory area operates as the main memory area or the repair memory area.

When the semiconductor memory device 100 is used in the first mode (that is, a normal mode), the mode control signal CTRL_MODE may have a first logic value (e.g., a logic low value "0"). The decoding circuit 170 may use the conversion memory area of the buffer 135 as the main memory area in response to the mode control signal CTRL_MODE having the first logic value.

When the semiconductor memory device 100 is used in the second mode (that is, a test mode), the mode control signal CTRL_MODE may have a second logic value (e.g., a logic high value "1"). The decoding circuit 170 may use the conversion memory area of the buffer 135 as the repair memory area in response to the mode control signal CTRL_MODE having the second logic value.

As described above, the semiconductor memory device 100 may use the conversion memory area of the buffer 135 as the main memory area or the repair memory area according to the mode control signal CTRL_MODE. Thus, a storage space of the buffer 135 can be flexibly used.

In the read operation, the voltage generator 150 generates the read voltage Vread and the pass voltage Vpass in response to a control signal received from the control logic 140. In order to generate a plurality of voltages having various voltage levels, the voltage generator 150 may include a plurality of pumping capacitors for receiving an internal power voltage, and generate a plurality of voltages by selectively activating the plurality of pumping capacitors under the control of the control logic 140.

Although not shown in detail in FIG. 2, the semiconductor memory device 100 may further include an input/output unit that receives data DATA from an outside (e.g., the controller 1100 of FIG. 1) and transfers the data DATA to the decoding circuit 170, or receives data DATA from the decoding circuit 170 and transfers the data DATA to the outside. The command CMD and the control signal CTRL may be transferred to the control logic 140 through the input/output unit.

Figure 3:
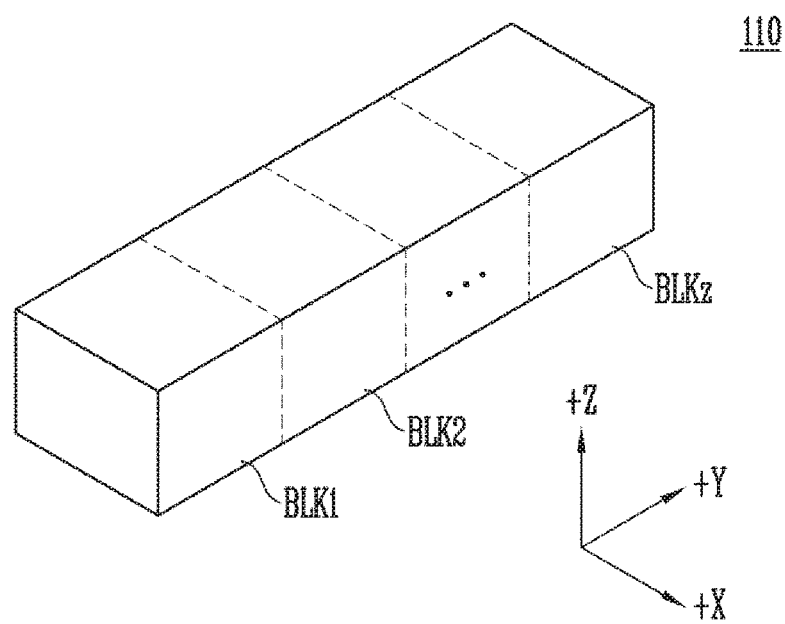
FIG. 3 is a diagram illustrating an embodiment of a memory cell array shown in FIG. 2.

FIG. 3 is a diagram illustrating an embodiment of a memory cell array 110 shown in FIG. 2.

Referring to FIG. 3, the memory cell array 110 includes a plurality of memory blocks BLK1 to BLKz. Each memory block has a three-dimensional structure. Each memory block includes a plurality of memory cells stacked above a substrate. Each of plurality of memory cells is arranged along +X, +Y, and +Z directions. The structure of each memory block is described in more detail with reference to FIGS. 4 and 5.

Figure 4:
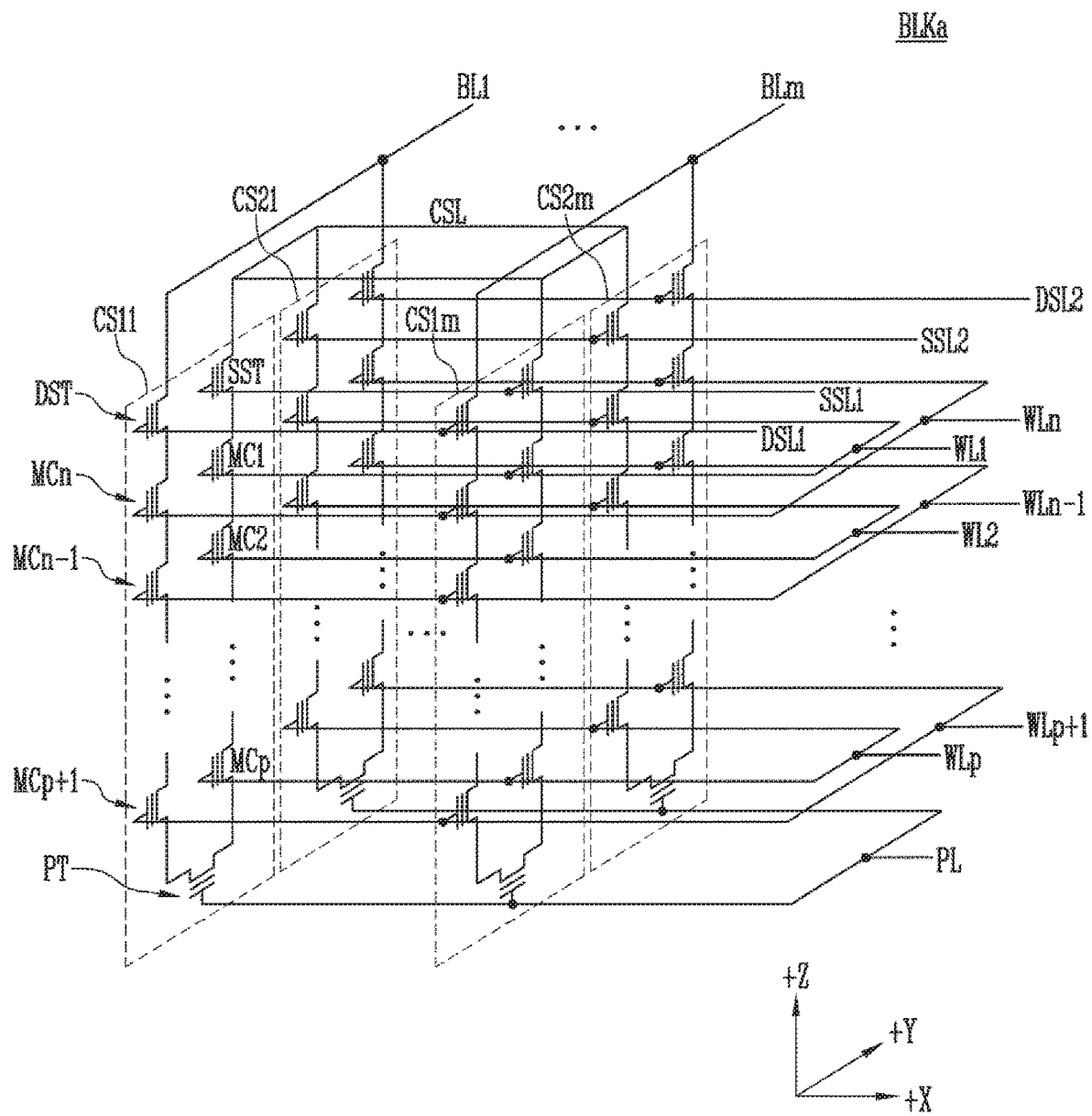
FIG. 4 is a circuit diagram illustrating a representative memory block among memory blocks, such as those shown in FIG. 3.

FIG. 4 is a circuit diagram illustrating a representative memory block BLKa among the memory blocks BLK1 to BLKz shown in FIG. 3.

Referring to FIG. 4, the memory block BLKa includes a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). In FIG. 4, it is illustrated that two cell strings are arranged in a column direction (i.e., a +Y direction). Alternatively, three cell strings may be arranged in the column direction.

Each of the plurality of cell strings CS11 to CS1$m$ and CS21 to CS2$m$ includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1$m$ on a first row are coupled to a first source select line SSL1. The source select transistors of the cell strings CS21 to CS2$m$ on a second row are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. When any one of the drain select lines DSL1 and DSL2 is selected, cell strings arranged in one row direction may be selected. When any one of the word lines WL1 to WLn is selected, one page may be selected in the selected cell strings.

In another embodiment, even bit lines and odd bit lines may be provided instead of the first to mth bit lines BL1 to BLm. Even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each of the dummy memory cells may have a required threshold voltage. Before or after an erase operation of the memory block BLKa, a program operation may be performed on all or some of the dummy memory cells. When an erase operation is performed after the program operation is performed, by controlling a voltage applied to the dummy word lines coupled to the respective dummy memory cells, the dummy memory cells can have the required threshold voltage.

Figure 5:
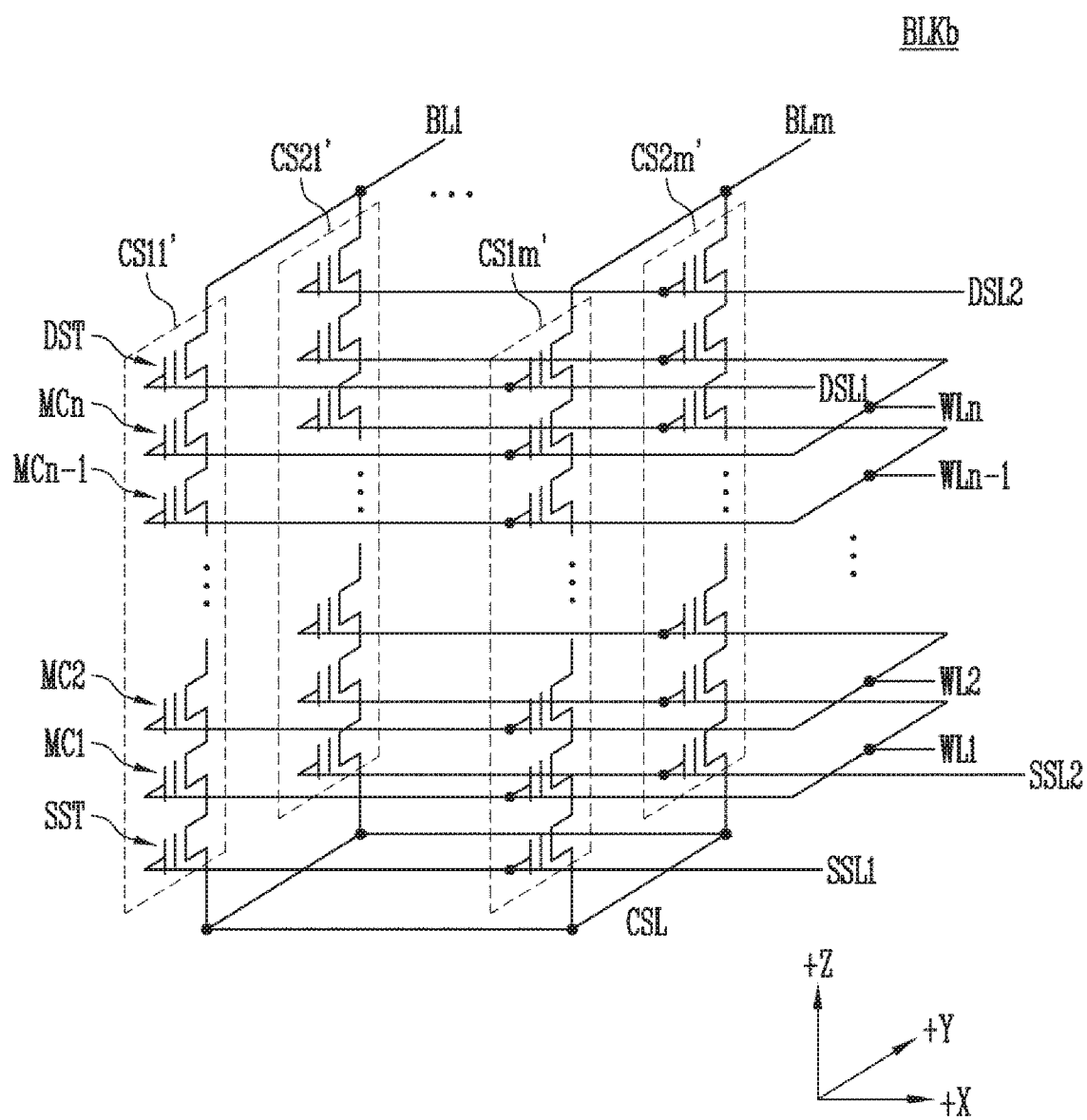
FIG. 5 is a circuit diagram illustrating another embodiment of a representative memory block among a plurality of memory blocks, such as those shown in FIG. 3.

FIG. 5 is a circuit diagram illustrating another embodiment of a representative memory block BLKb among the memory blocks BLK1 to BLKz shown in FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit identical to that of the memory block BLKa of FIG. 4, except that the pipe transistor PT is excluded from each cell string.

In another embodiment, even bit lines and odd bit lines may be provided instead of the first to mth bit lines BL1 to BLm. Even-numbered cell strings among the cell strings CS11' to CS1m' or CS21' to CS2m' arranged in the row direction may be coupled to the even bit lines, respectively. Odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCn. Alternatively, the dummy memory cell(s) may be provided to decrease an electric field between the drain select transistor DST and the memory cells MC1 to MCn. When the number of dummy memory cells increases, the reliability of an operation of the memory block BLKb is improved. On the other hand, the size of the memory block BLKb increases. When the number of dummy memory cells decreases, the size of the memory block BLKb decreases. On the other hand, the reliability of an operation of the memory block BLKb may be deteriorated.

In order to efficiently control the dummy memory cell(s), each of the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells controls a voltage applied to the dummy word lines coupled to the respective dummy memory cells, so that the dummy memory cells can have the required threshold voltage.

Figure 6:
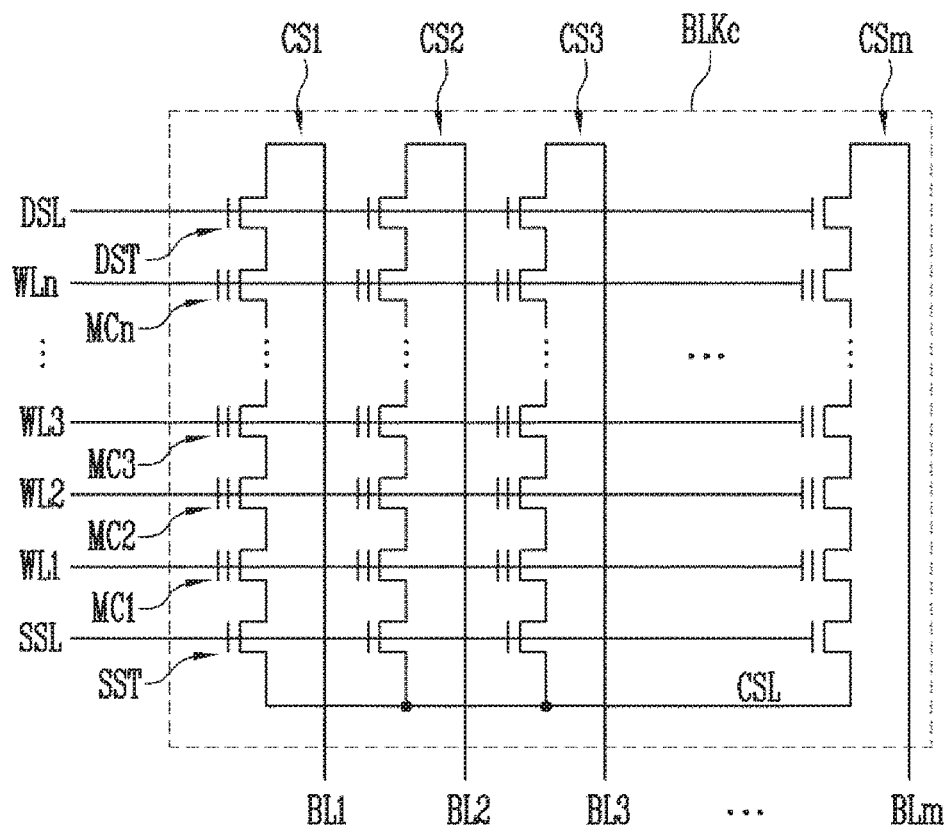
FIG. 6 is a circuit diagram illustrating an embodiment of a representative memory block among a plurality of memory blocks included in a memory cell array, such as that shown in FIG. 2.

FIG. 6 is a circuit diagram illustrating a representative memory block BLKc among the plurality of memory blocks BLK1 to BLKz included in the memory cell array 110 shown in FIG. 2.

Referring to FIG. 6, the memory block BLKc includes a plurality of strings CS1 to CSm. The plurality of strings CS1 to CSm may be coupled to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In another embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to nth memory cells MC1 to MCn of each cell string is coupled between the source select transistor SST and the drain select transistor DST.

The drain select transistor DST of each cell string is coupled between a corresponding bit line and the memory cells MC1 to MCn.

Memory cells coupled to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm arranged may be coupled to the even bit lines, respectively. Odd-numbered cell strings among the cell strings CS1 to CSm may be coupled to the odd bit lines, respectively.

Figure 7:
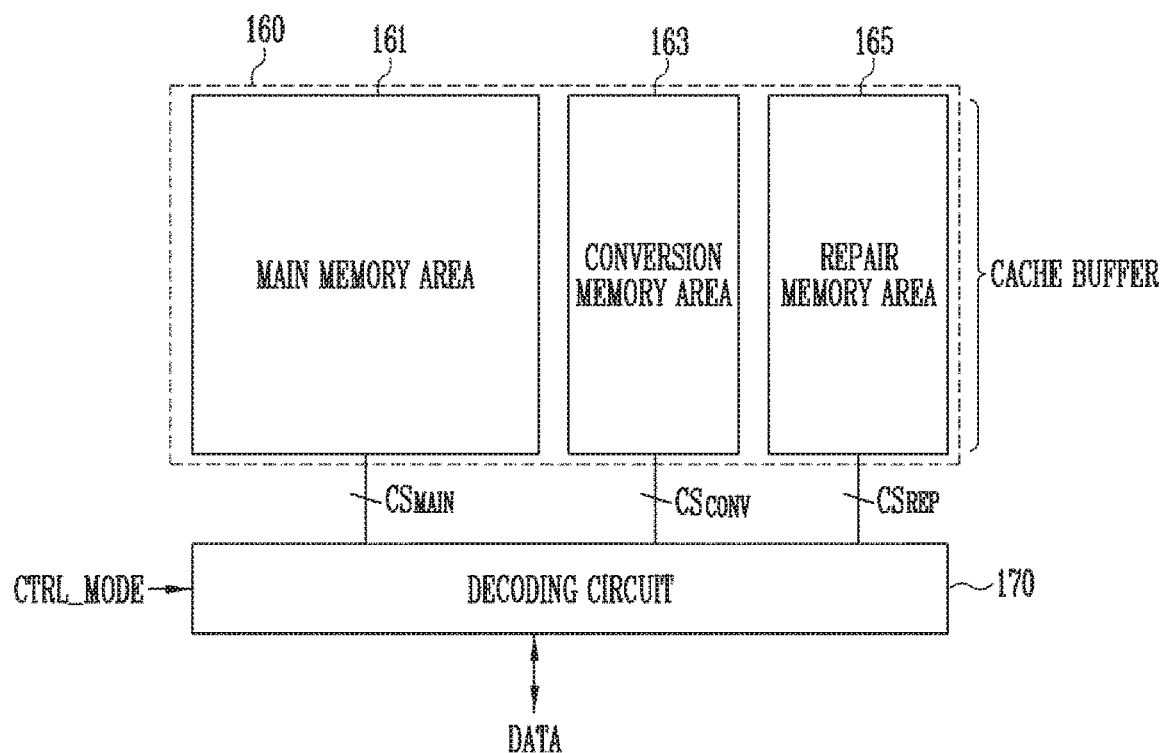
FIG. 7 is a block diagram illustrating a cache buffer and a decoding circuit in accordance with an embodiment of the present disclosure.

FIG. 7 is a block diagram illustrating a cache buffer and a decoding circuit, e.g., the cache buffer 160 and the decoding circuit 170 of FIG. 2, in accordance with an embodiment of the present disclosure.

Referring to FIG. 7, the cache buffer 160 includes a main memory area 161, a conversion memory area 163, and a repair memory area 165. The main memory area 161 is coupled to the decoding circuit 170 through a main column select line $CS_{MAIN}$. The conversion memory area 163 is coupled to the decoding circuit 170 through a conversion column select line $CS_{CONV}$. The repair memory area 165 is coupled to the decoding circuit 170 through a repair column select line $CS_{REP}$.

FIG. 7 illustrates an embodiment in which the cache buffer 160 includes the main memory area 161, the conversion memory area 163, and the repair memory area 165. In another embodiment, the buffer 135 may have a structure that does not include the cache buffer 160 but includes only the page buffer 130. Therefore, in that embodiment, the page buffer 130 may include the main memory area, the conversion memory area, and the repair memory area.

The decoding circuit 170 uses the conversion memory area 163 as the main memory area or the repair memory area in response to the mode control signal CTRL_MODE received from the control logic 140. A more detailed configuration and operation of the decoding circuit 170 is described below with reference to FIGS. 9 to 28.

Figure 8:
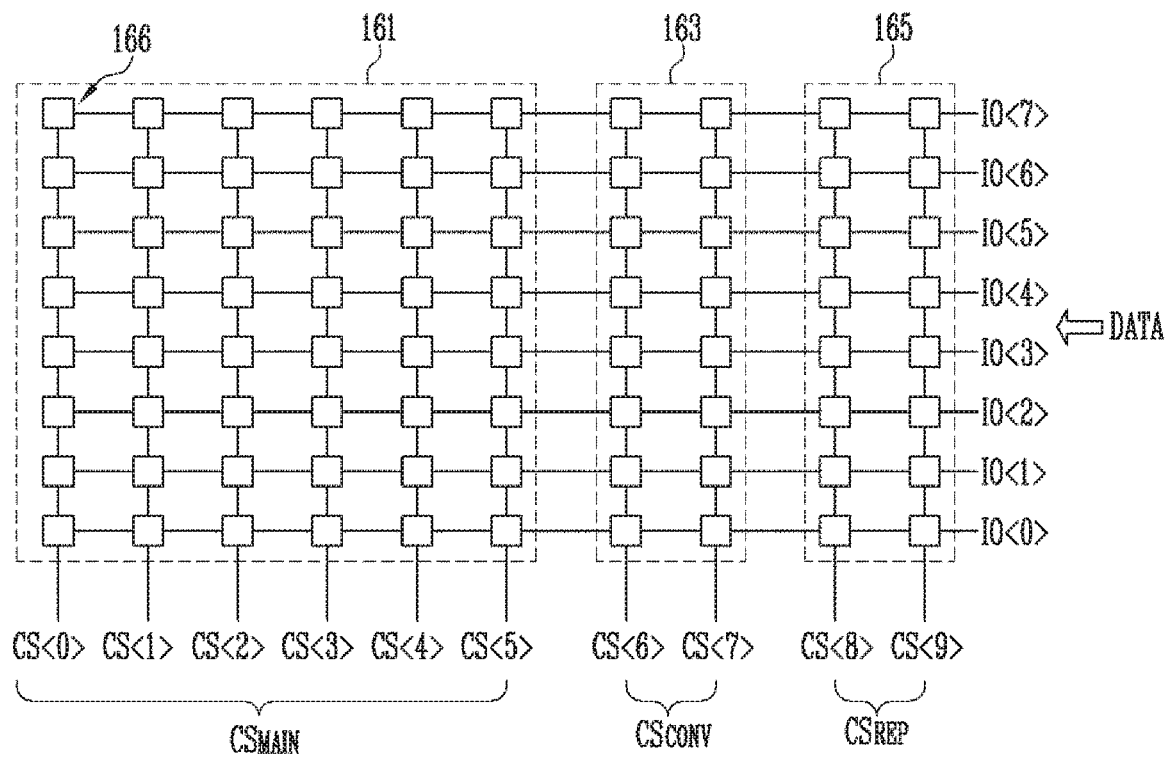
FIG. 8 is a diagram illustrating a cache buffer, such as that shown in FIG. 7, in accordance with an embodiment of the present disclosure.

FIG. 8 is a diagram illustrating a cache buffer, e.g., the cache buffer 160 shown in FIG. 7, in accordance with an embodiment of the present disclosure. By way of example, an embodiment in which the main column select line $CS_{MAIN}$ is configured with six lines, and each of the conversion column select line $CS_{CONV}$ and the repair column select line $CS_{REP}$ is configured with two lines is illustrated in FIG. 8. However, the structure of the cache buffer is not limited to that configuration. Alternatively, in another embodiment, the cache buffer 160 may include different numbers of main column select lines $CS_{MAIN}$, conversion column select lines $CS_{CONV}$, and repair column select lines $CS_{REP}$ than shown in FIG. 8.

Referring to FIG. 8, the cache buffer 160 includes a plurality of cache latches 166. Each of the cache latches 166 may store one bit of data.

Each of the cache latches 166 is coupled to a corresponding one of input/output lines IO<7:0>, and is coupled to a corresponding one of column select lines. By way of example, zeroth to fifth column select lines CS<0> to CS<5>, i.e., CS<5:0> are included in the main column select line $CS_{MAIN}$. Sixth and seventh column select lines CS<6> and CS<7>, i.e., CS<7:6> are included in the conversion column select line $CS_{CONV}$. Eighth and ninth column select lines CS<8> and CS<9>, i.e., CS<9:8> are included in the repair column select line $CS_{REP}$.

For example, cache latches located on a first row from the bottom are coupled to a zeroth input/output line IO<0>. Cache latches located on a second row are coupled to a first input/output line IO<1>.

Cache latches located on a first column are coupled to the zeroth column select line CS<0>, and cache latches located on a second column are coupled to the first column select line CS<1>.

The semiconductor memory device 100 of FIG. 2 may operate in a unit of one byte (i.e., 8 bits). Accordingly, an input/output operation is performed in a unit of 8 bits. Therefore, eight cache latches 166 are coupled to one column as shown in FIG. 8. Data DATA is transferred through the input/output lines IO<7:0>.

In order to perform a sequential operation, signals transferred to the zeroth to fifth column select lines CS<5:0> belonging to the main column select line $CS_{MAIN}$ may be sequentially activated according to a column address increased in the cache buffer 160.

Cache latches coupled to the main column select line $CS_{MAIN}$ operate as the main memory area 161. Cache latches coupled to the repair column select line $CS_{REP}$ operate as the repair memory area 165. Cache latches coupled to the conversion column select line $CS_{CONV}$ operate as the conversion memory area 163. The cache latches coupled to the conversion column select line $CS_{CONV}$ are used as the main memory area or the repair memory area according to a value of the mode control signal CTRL_MODE.

When the semiconductor memory device 100 operates in the first mode (that is, a normal mode), the mode control signal CTRL_MODE may have a value of 0. The cache latches coupled to the conversion column select line $CS_{CONV}$ may be used as a main latch together with the cache latches coupled to the main column select line $CS_{MAIN}$. When the semiconductor memory device 100 operates in the second mode (that is, a test mode), the mode control signal CTRL_MODE may have a value of 1. The cache latches coupled to the conversion column select line $CS_{CONV}$ may be used as a repair latch together with the cache latches coupled to the repair column select line $CS_{REP}$.

Figure 9:
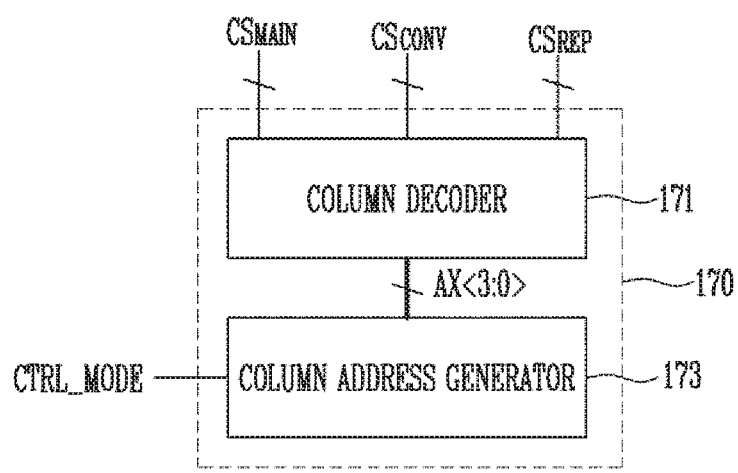
FIG. 9 is a block diagram illustrating a decoding circuit, such as that shown in FIG. 7, in accordance with an embodiment of the present disclosure.

FIG. 9 is a block diagram illustrating a decoding circuit, e.g., the decoding circuit 170 shown in FIG. 7, in accordance with an embodiment of the present disclosure.

Referring to FIG. 9, the decoding circuit 170 includes a column decoder 171 and a column address generator 173.

The column decoder 171 is coupled to a cache buffer (e.g., the cache buffer 160 of FIG. 8) through column select lines. More specifically, the column decoder 171 is coupled to the main memory area 161 through the main column select line $CS_{MAIN}$, is coupled to the conversion memory area 163 through the conversion column select line $CS_{CONV}$, and is coupled to the repair memory area 165 through the repair column select line $CS_{REP}$. The column decoder 171 decodes the column select lines, based on an address signal provided from the column address generator 173.

The column address generator 173 is coupled to the column decoder 171 through address lines AX<3:0>. The column address generator 173 may generate an address signal transmitted through the address lines AX<3:0>, based on the mode control signal CTRL_MODE.

When the semiconductor memory device 100 operates in the first mode (that is, a normal mode), the mode control signal CTRL_MODE may have a value of 0, and the column address generator 173 may generate an address signal such that the cache latches included in the conversion memory area 163 are used as the main latch together with the cache latches included in the main memory area 161. When the semiconductor memory device 100 operates in the second mode (that is, a test mode), the mode control signal CTRL_MODE may have a value of 1, and the column address generator 173 may generate an address signal such that the cache latches included in the conversion memory area 163 are used as the repair latch together with the cache latches included in the repair memory area 165.

Since the total number of column select lines is ten in the example shown in FIG. 8, at least four address lines are required to perform decoding. Accordingly, the number of the address lines AX<0> to AX<3>, i.e., AX<3:0> is four. When the number of address lines is four, the decoding may be performed on up to 16 column select lines.

Figure 10:
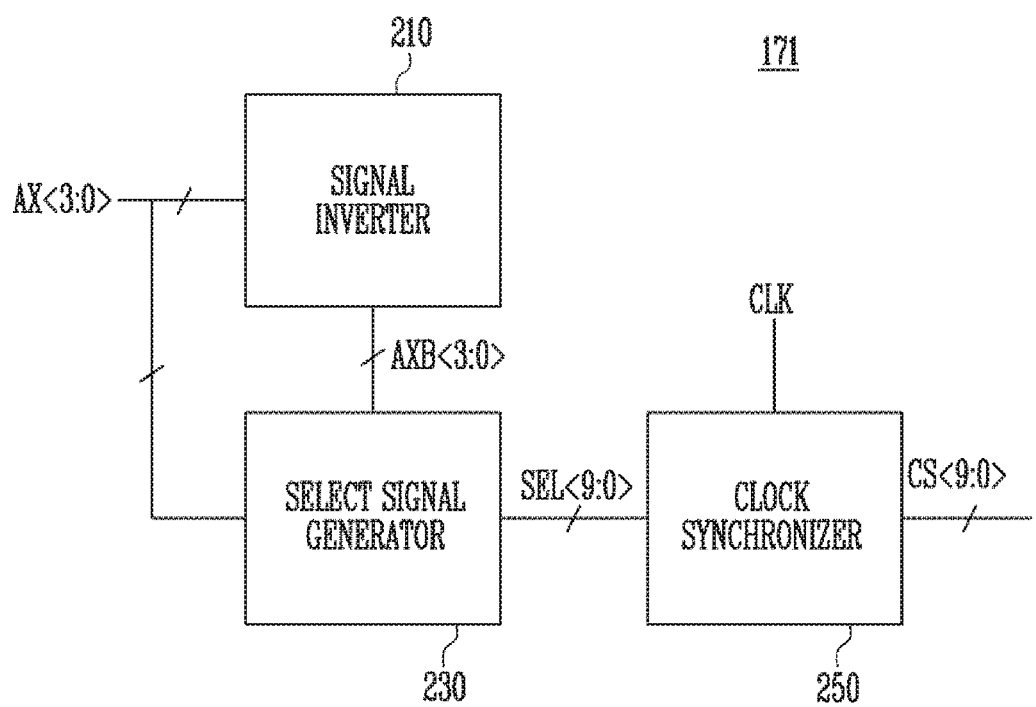
FIG. 10 is a block diagram illustrating a column decoder, such as that shown in FIG. 9, in accordance with an embodiment of the present disclosure.

FIG. 10 is a block diagram illustrating a column decoder, e.g., the column decoder 171 shown in FIG. 9, in accordance with an embodiment of the present disclosure.

Referring to FIG. 10, the column decoder 171 may include a signal inverter 210, a select signal generator 230, and a clock synchronizer 250. The signal inverter 210 inverts an address signal received through the address lines AX<3:0> and outputs the inverted address signal to inverting address lines AXB<3:0>. The select signal generator 230 outputs, to select lines SEL<9:0>, a select signal generated by decoding the address signal input through the address lines AX<3:0> and the inverted address signal input through the inverting address lines AXB<3:0>. The clock synchronizer 250 generates a column select signal by synchronizing the select signal input through the select lines SEL<9:0> with a clock signal CLK.

Figure 11:
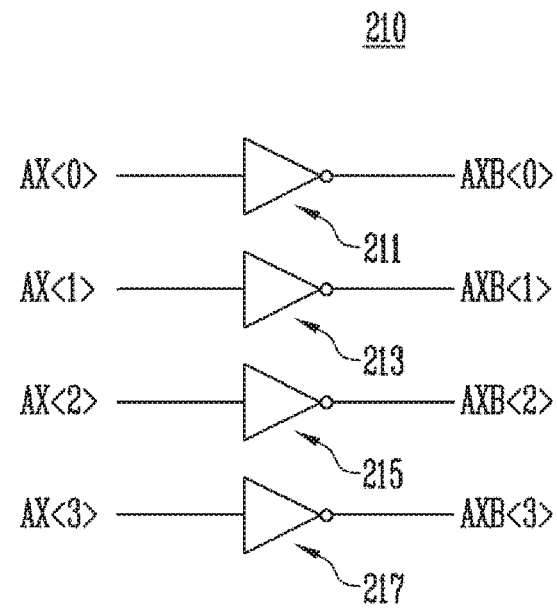
FIG. 11 is a circuit diagram illustrating a signal inverter, such as that shown in FIG. 10, in accordance with an embodiment of the present disclosure.

FIG. 11 is a circuit diagram illustrating a signal inverter, e.g., the signal inverter 210 shown in FIG. 10, in accordance with an embodiment of the present disclosure.

Referring to FIG. 11, the signal inverter 210 may include four inverters 211, 213, 215, and 217. A zeroth inverter 211 inverts an address signal applied to a zeroth address line AX<0> and outputs the inverted address signal to a zeroth inverting address line AXB<0>. First to third inverters 213, 215, and 217 invert address signals applied to first to third address lines AX<3:1> and output the inverted address signals to first to third inverting address lines AXB<3:1>, respectively.

Figure 12:
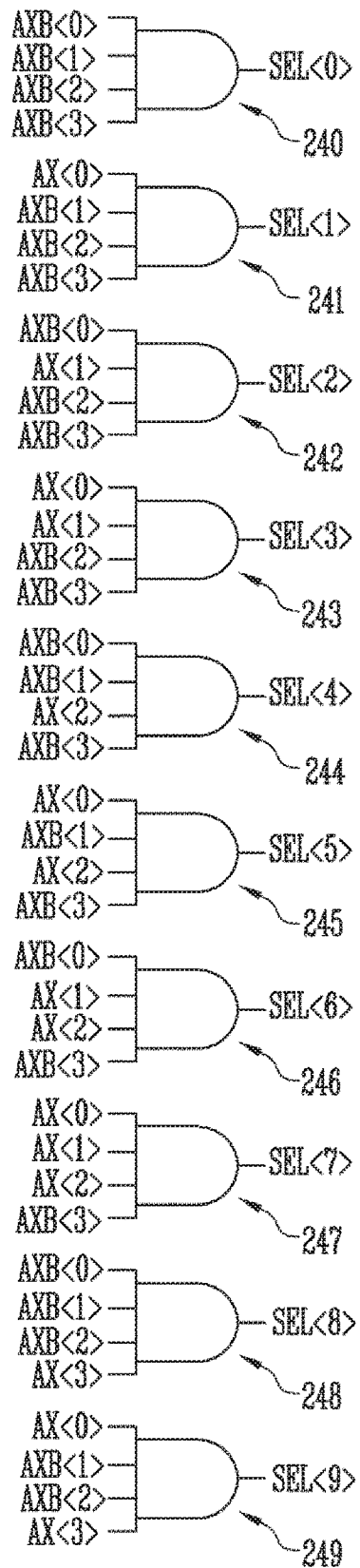
FIG. 12 is a circuit diagram illustrating a select signal generator, such as that shown in FIG. 10, in accordance with an embodiment of the present disclosure.

FIG. 12 is a circuit diagram illustrating a select signal generator, e.g., the select signal generator 230 shown in FIG. 10, in accordance with an embodiment of the present disclosure.

Referring to FIG. 12, the select signal generator 230 includes ten AND gates 240 to 249. Each AND gate enables any one of select lines SEL<9:0> by decoding address signals input through the address lines AX<3:0> and the inverting address lines AXB<3:0>.

Regarding a zeroth AND gate 240, the zeroth to third inverting address lines AXB<3:0> are coupled as four inputs. When an inverting address signal has a value of 1111, i.e., when an address signal has a value of 0000, a zeroth select line SEL<0> is enabled.

Referring to a first AND gate 241, the zeroth address line AX<0> and the first to third inverting address lines AXB<3:1> are coupled as four inputs. When an inverting address signal has a value of 1110, i.e., when an address signal has a value of 0001, a first select line SEL<1> is enabled.

Referring to a second AND gate 242, the zeroth inverting address line AXB<0>, the first address line AX<1>, and the second and third inverting address lines AXB<3:2> are coupled as four inputs. When an inverting address signal has a value of 1101, i.e., when an address signal has a value of 0010, a second select line SEL<2> is enabled.

In this manner, each of the ten AND gates 240 to 249 of the select signal generator 230 enables any one of the select lines SEL<9:0> according to address signals input through the address lines AX<3:0> and the inverting address lines AX<3:0>.

Figure 13:
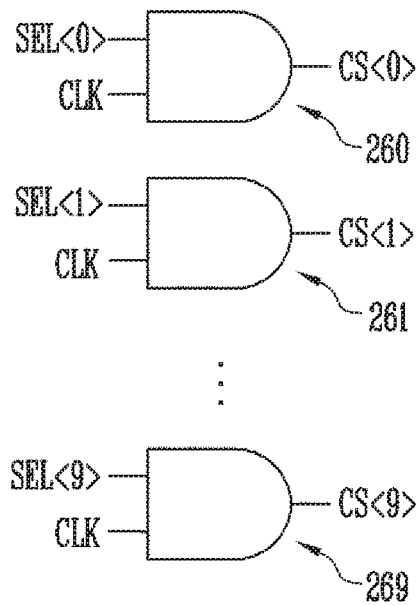
FIG. 13 is a circuit diagram illustrating a clock synchronizer, such as that shown in FIG. 10, in accordance with an embodiment of the present disclosure.

FIG. 13 is a circuit diagram illustrating a clock synchronizer, e.g., the clock synchronizer 250 shown in FIG. 10, in accordance with an embodiment of the present disclosure.

Referring to FIG. 13, the clock synchronizer 250 includes ten AND gates 260 to 269. Each gate receives a corresponding select line among the select lines SEL<9:0> and a clock signal CLK as inputs. Therefore, each of the AND gate enables any one of column lines CS<9:0> by synchronizing a select signal applied through the select lines SEL<9:0> with the clock signal CLK.

Figure 14:
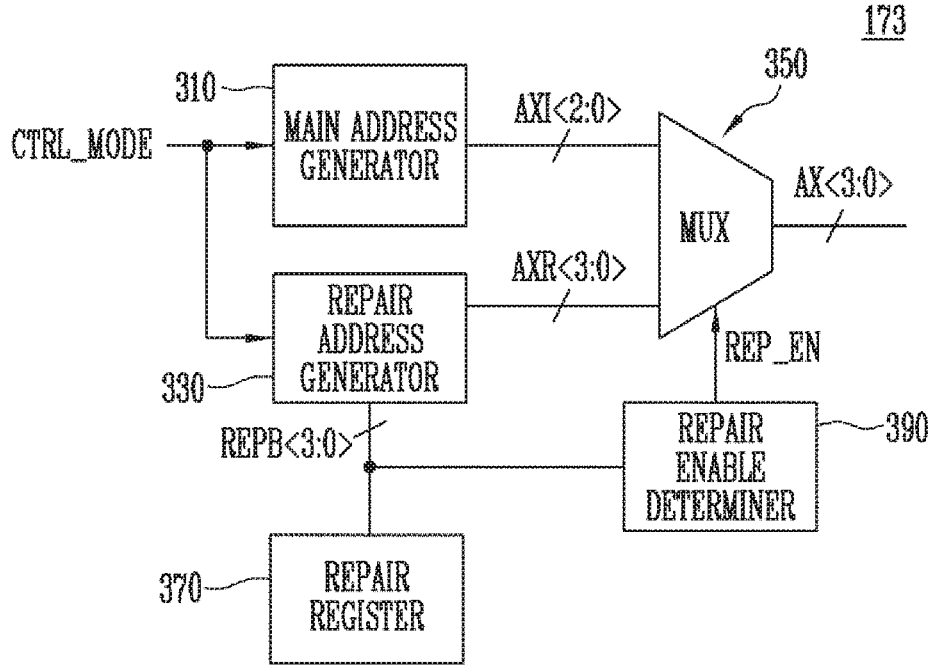
FIG. 14 is a block diagram illustrating a column address generator, such as that shown in FIG. 9, in accordance with an embodiment of the present disclosure.

FIG. 14 is a block diagram illustrating a column address generator, e.g., the column address generator 173 shown in FIG. 9, in accordance with an embodiment of the present disclosure.

Referring to FIG. 14, the column address generator 173 includes a main address generator 310, a repair address generator 330, a multiplexer (MUX) 350, a repair register 370 and a repair enable determiner 390.

The main address generator 310 outputs a main address signal through main address lines AXI<2:0>. More specifically, the main address generator 310 may receive a clock signal and the mode control signal CTRL_MODE, and generate a main address signal, which is sequentially increased according to the clock signal.

The repair address generator 330 generates a repair address, based on repair information stored in the repair register 370 and the mode control signal CTRL_MODE, and outputs the repair address to repair address lines AXR<3:0>. The repair register 370 may include a plurality of registers, and output the repair information. The outputted repair information is then transferred to the repair address generator 330 through repair register lines REPB<3:0>.

The repair enable determiner 390 generates a repair enable signal REP_EN, based on the repair information output from the repair register 370. The repair enable signal REP_EN is transferred to the multiplexer 350. The multiplexer 350 outputs any one of the main address signal and the repair address signal to the address lines AX<3:0>, based on the repair enable signal REP_EN.

When the repair enable signal REP_EN has a logic low value, the multiplexer 350 outputs the main address signal received through the main address lines AXI<2:0> to the address lines AX<3:0>. When the repair enable signal REP_EN has a logic high value, the multiplexer 350 outputs the repair address signal received through the repair address lines AXR<3:0> to the address lines AX<3:0>.

Figure 15:
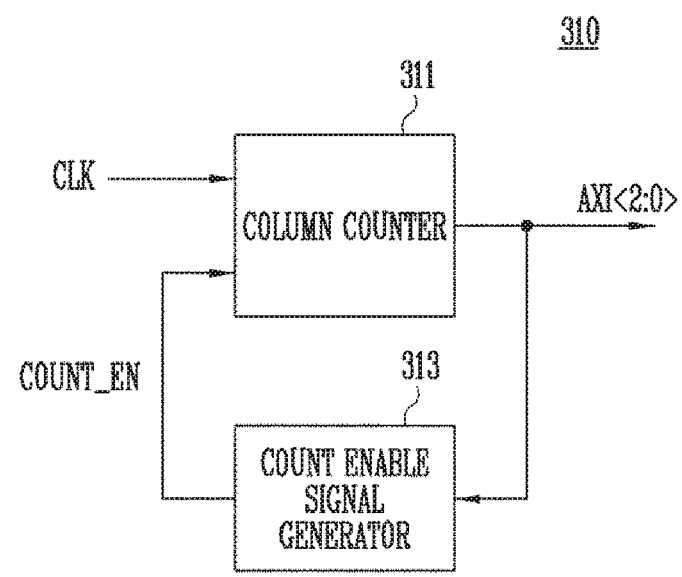
FIG. 15 is a block diagram illustrating a main address generator, such as that shown in FIG. 14, in accordance with an embodiment of the present disclosure.

FIG. 15 is a block diagram illustrating a main address generator, e.g., the main address generator 310 shown in FIG. 14, in accordance with an embodiment of the present disclosure.

Referring to FIG. 15, the main address generator 310 may include a column counter 311 and a count enable signal generator 313. The column counter 311 generates a main address signal, which is sequentially increased by 1 in every clock period, based on a clock signal CLK. The column counter 311 outputs the main address signal to the main address lines AXI<2:0>. More specifically, the column counter 311 may generate a main address signal, which is sequentially increased from a value of 0 to a specific end value, based on a count enable signal COUNT_EN output from the count enable signal generator 313. The end value may be determined based on the mode control signal CTRL_MODE.

The count enable signal generator 313 generates a count enable signal COUNT_EN, based on the main address signal output from the column counter 311. The count enable signal COUNT_EN may be a signal for controlling a counting operation of the column counter 311.

While the count enable signal COUNT_EN is being enabled, the column counter 311 sequentially increases a value of the main address signal by 1, based on the clock signal CLK. The count enable signal generator 313 inactivates the count enable signal COUNT_EN when the main address signal reaches a specific value. When the count enable signal COUNT_EN is inactivated, the column counter 311 does not increase the value of the main address signal but maintains the value of the main address signal.

The value of the main address signal, which inactivates the count enable signal COUNT_EN, is determined based on the mode control signal CTRL_MODE.

Referring again to FIG. 8 together with FIG. 15, when the mode control signal CTRL_MODE has a value of 0, the conversion memory area 163 is used as the main memory area. Therefore, the conversion column select line $CS_{CONV}$, i.e., the sixth and seventh column select lines CS<7:6> coupled to the conversion memory area 163 are to be decoded by the main address signal. A value of the column counter is to be increased from 0 to 7 such that the seventh column select line CS<7> can be decoded. Thus, the count enable signal generator 313 inactivates the count enable signal COUNT_EN at a time at which the main address signal reaches a value of 7. When the mode control signal CTRL_MODE has a value of 0, the column counter 311 sequentially increases the main address signal by 1 in every clock period from 0 to 7, and the main address signal is no longer increased after 7.

When the mode control signal CTRL_MODE has a value of 0, the main address generator 310 generates a main address signal for selecting the main column select line $CS_{MAIN}$ and the conversion column select line $CS_{CONV}$. In addition, the repair address generator 330 generates a repair address signal for selecting the repair column select line $CS_{REP}$.

When the mode control signal CTRL_MODE has a value of 1, the conversion memory area 163 is used as the repair memory area. Therefore, the conversion column select line $CS_{CONV}$, i.e., the sixth and seventh column select lines CS<7:6> coupled to the conversion memory area 163 are to be decoded by the repair address signal. A value of the column counter is to be increased from 0 to 5 such that the sixth and seventh column select lines CS<7:6> are not decoded. Thus, the count enable signal generator 313 inactivates the count enable signal COUNT_EN at a time at which the main address signal reaches a value of 5. When the mode control signal CTRL_MODE has a value of 1, the column counter 311 sequentially increases the main address signal by 1 in every clock period from 0 to 5, and the main address signal is no longer increased after 5.

That is, when the mode control signal CTRL_MODE has a value of 1, the main address generator 310 generates a main address signal for selecting the main column select line $CS_{MAIN}$. In addition, the repair address generator 330 generates a repair address signal for selecting the conversion column select line $CS_{CONV}$ and the repair column select line $CS_{REP}$.

Figure 16:
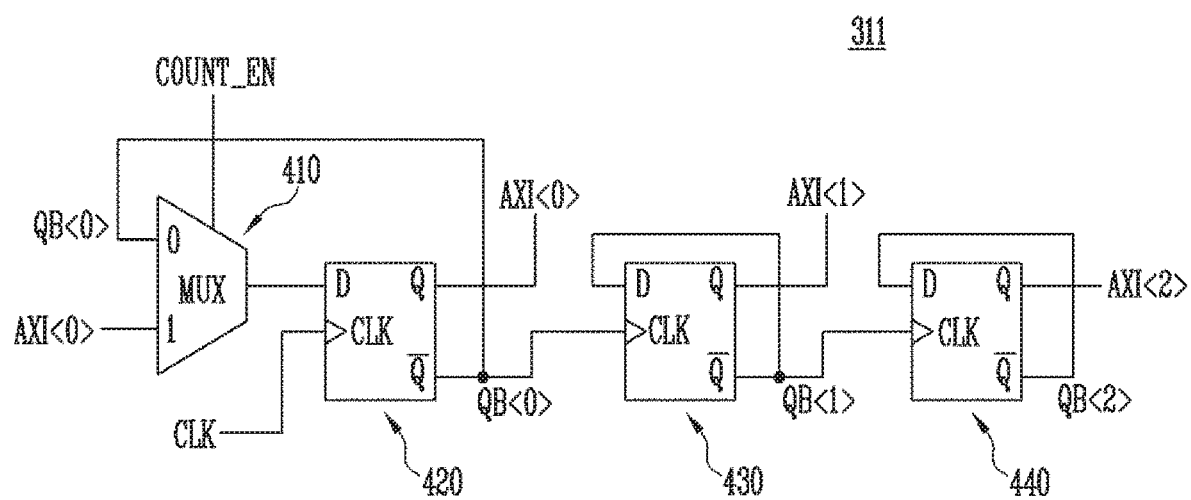
FIG. 16 is a block diagram illustrating a column counter, such as that shown in FIG. 15, in accordance with an embodiment of the present disclosure.

FIG. 16 is a block diagram illustrating a column counter, e.g., the column counter 311 shown in FIG. 15, in accordance with an embodiment of the present disclosure.

Referring to FIG. 16, the column counter 311 includes a multiplexer (MUX) 410 and first to third flip-flops 420, 430, and 440. The multiplexer 410 receives an inverting output QB<0> of the first flip-flop 420 and is coupled to a zeroth main address line AXI<0>. An input terminal D of the first flip-flop 420 is coupled to an output terminal of the multiplexer 410. A non-inverting output terminal Q of the first flip-flop 420 is coupled to the zeroth main address line AXI<0>. The inverting output QB<0> is coupled to a clock input terminal CLK of the second flip-flop 430.

An input terminal D of the second flip-flop 430 is coupled to an inverting output QB<1>. A non-inverting output terminal Q of the second flip-flop 430 is coupled to a first main address line AXI<1>. The inverting output QB<1> of the second flip-flop 430 is coupled to a clock input terminal CLK of the third flip-flop 440.

An input terminal D of the third flip-flop 440 is coupled to an inverting output QB<2>. A non-inverting output terminal Q of the third flip-flop 440 is coupled to a second main address line AXI<2>.

When the count enable signal COUNT_EN is activated, the multiplexer 410 transfers a zeroth main address signal applied to the zeroth main address line AXI<0> to the input terminal D of the first flip-flop 420. Therefore, the main address signal output through the main address lines AXI<2:0> is increased by 1 according to a period of the clock signal CLK.

When the count enable signal COUNT_EN is inactivated, the multiplexer 410 transfers the inverting output QB<0> of the first flip-flop 420 to the input terminal D of the first flip-flop 420. Therefore, the main address signal output through the main address lines AXI<2:0> is not increased but maintained.

Figure 17:
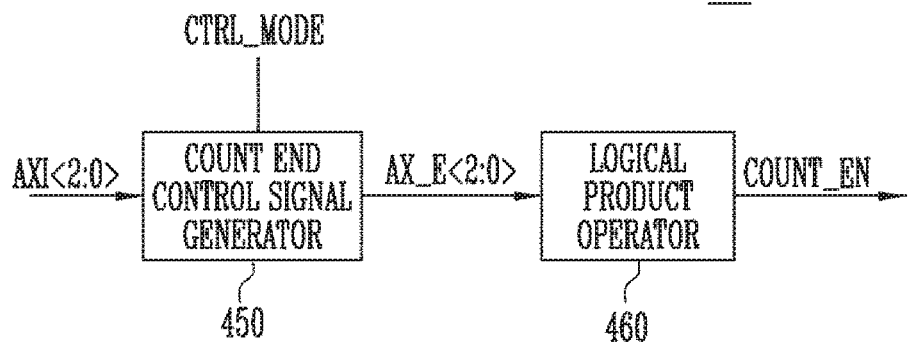
FIG. 17 is a block diagram illustrating a count enable signal generator, such as that shown in FIG. 15, in accordance with an embodiment of the present disclosure.

FIG. 17 is a block diagram illustrating a count enable signal generator, e.g., the count enable signal generator 313 shown in FIG. 15, in accordance with an embodiment of the present disclosure.

Referring to FIG. 17, the count enable signal generator 313 includes a count end control signal generator 450 and a logical product operator 460. The count end control signal generator 450 generates a count reference signal, based on the mode control signal CTRL_MODE, and outputs the count reference signal through a count reference line AX_E<2:0>. More specifically, the count enable signal generator 313 may generate the count reference signal by selecting a first count value or a second count value, based on the mode control signal CTRL_MODE. The logical product operator 460 generates the count enable signal COUNT_EN by performing a logical product operation on each bit value of the count reference signal input through the count reference lines AX_E<2:0>.

Figure 18A:
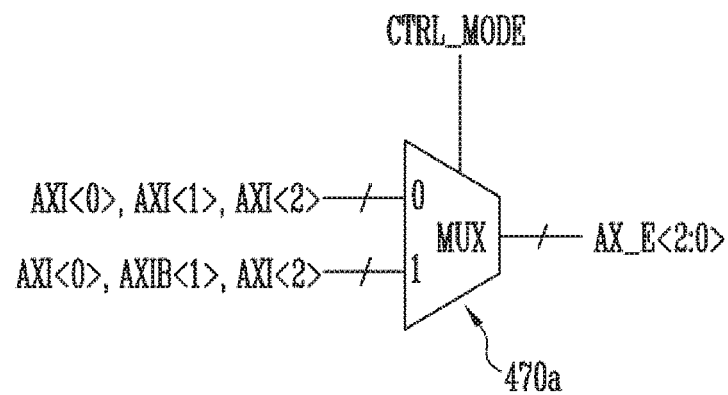
FIGS. 18A and 18B are block diagrams illustrating a count end control signal generator, such as that shown in FIG. 17, in accordance with an embodiment of the present disclosure.
Figure 18B:
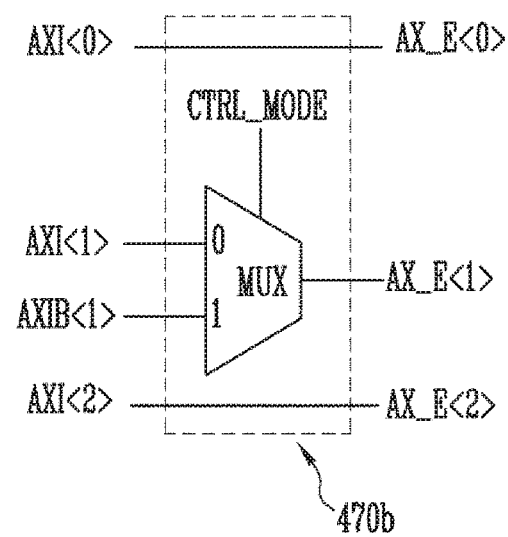

FIGS. 18A and 18B are block diagrams illustrating a count end control signal generator, e.g., a count end control signal generator 450 shown in FIG. 17, in accordance with an embodiment of the present disclosure.

Referring to FIG. 18A, the count end control signal generator 450 includes a multiplexer (MUX) 470a. An input terminal of the multiplexer 470a is coupled to first lines and second lines. The first lines include zeroth to second main address lines AXI<0>, AXI<1>, and AXI<2>. The second lines include the zeroth main address line AXI<0>, a first inverting main address line AXIB<1>, and the second main address line AXI<2>. The multiplexer 470a couples the first lines or the second lines to the count reference lines AX_E<2:0>, based on the mode control signal CTRL_MODE.

When the mode control signal CTRL_MODE has a value of 0, the multiplexer 470a couples the first lines, i.e., the zeroth to second main address lines AXI<0>, AXI<1>, and AXI<2> to the count reference lines AX_E<2:0>. When the mode control signal CTRL_MODE has a value of 1, the multiplexer 470a couples the second lines, i.e., the zeroth main address line AXI<0>, the first inverting main address line AXIB<1>, and the second main address line AXI<2> to the count reference lines AX_E<2:0>.

FIG. 18B illustrates a block diagram that is equivalent to the drawing shown in FIG. 18A. A count end control signal generator 470b shown in FIG. 18B is equivalent to the multiplexer 470a shown in FIG. 18A.

Referring to FIGS. 18A and 18B together, when the mode control signal CTRL_MODE has the value of 0, a zeroth count reference line AX_E<0> is coupled to the zeroth main address line AXI<0>. When the mode control signal CTRL_MODE has a value of 1, the zeroth count reference line AX_E<0> is also coupled to the zeroth main address line AXI<0>.

When the mode control signal CTRL_MODE has a value of 0, a first count reference line AX_E<1> is coupled to the first main address line AXI<1>. When the mode control signal CTRL_MODE has a value of 1, the first count reference line AX_E<1> is coupled to the first inverting main address line AXIB<1>.

When the mode control signal CTRL_MODE has a value of 0, a second count reference line AX_E<2> is coupled to the second main address line AXI<2>. When the mode control signal CTRL_MODE has a value of 1, the second count reference line AX_E<2> is also coupled to the second main address line AXI<2>.

Figure 19:
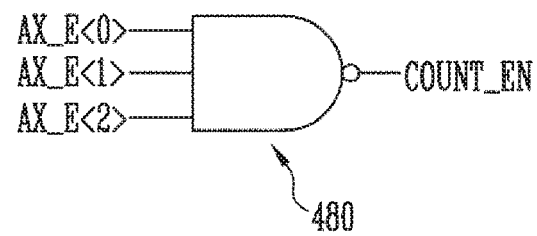
FIG. 19 is a diagram illustrating a logical product operator, such as that shown in FIG. 17, in accordance with an embodiment of the present disclosure.

FIG. 19 is a diagram illustrating a logical product operator, e.g., the logical product operator 460 shown in FIG. 17, in accordance with an embodiment of the present disclosure.

Referring to FIG. 19, the logical product operator 460 may be configured with a NAND gate 480. The NAND gate 480 inactivates the count enable signal COUNT_EN only when values of the zeroth to second count reference lines AX_E<2:0> are all 1. Otherwise, the NAND gate 480 activates the count enable signal COUNT_EN. Such operations are described with reference to FIGS. 18A, 18B, and 19 together.

When the mode control signal CTRL_MODE has a value of 0, a zeroth reference count line AX_E<0> is coupled to the zeroth main address line AXI<0>, a first count reference line AX_E<1> is coupled to the first main address line AXI<1>, and a second count reference line AX_E<2> is coupled to the second main address line AXI<2>. Therefore, when a main address signal applied through the zeroth to second main address lines AXI<2:0> has a value of 111, the NAND gate 480 inactivates the count enable signal COUNT_EN. In other words, the count enable signal COUNT_EN is inactivated when the main address signal applied through the zeroth to second main address lines AXI<2:0> has a value of 7, and otherwise is activated.

Referring to FIG. 19 together with FIG. 15, when the mode control signal CTRL_MODE has a value of 0, the count enable signal generator 313 activates the count enable signal when the main address signal has a value of 7, and the column counter 311 stops the counting operation and maintains the main address signal when the main address signal becomes a value of 7.

When the mode control signal CTRL_MODE has a value of 1, the zeroth count reference line AX_E<0> is coupled to the zeroth main address line AX1<0>, the first count reference line AX_E<1> is coupled to the first inverting main address line AXIB<1>, and the second count reference line AX_E<2> is coupled to the second main address line AXI<2>. Therefore, when a main address signal applied through the zeroth to second main address lines AXI<2:0> has a value of 101, the NAND gate 480 inactivates the count enable signal COUNT_EN. In other words, the count enable signal COUNT_EN is inactivated when the main address signal applied through the zeroth to second main address lines AXI<2:0> has a value of 5, and otherwise is activated.

Referring to FIG. 19 together with FIG. 15, when the mode control signal CTRL_MODE has a value of 1, the count enable signal generator 313 activates the count enable signal when the main address signal has a value of 5, and the column counter 311 stops the counting operation and maintains the main address signal when the main address signal becomes a value of 5.

Figure 20:
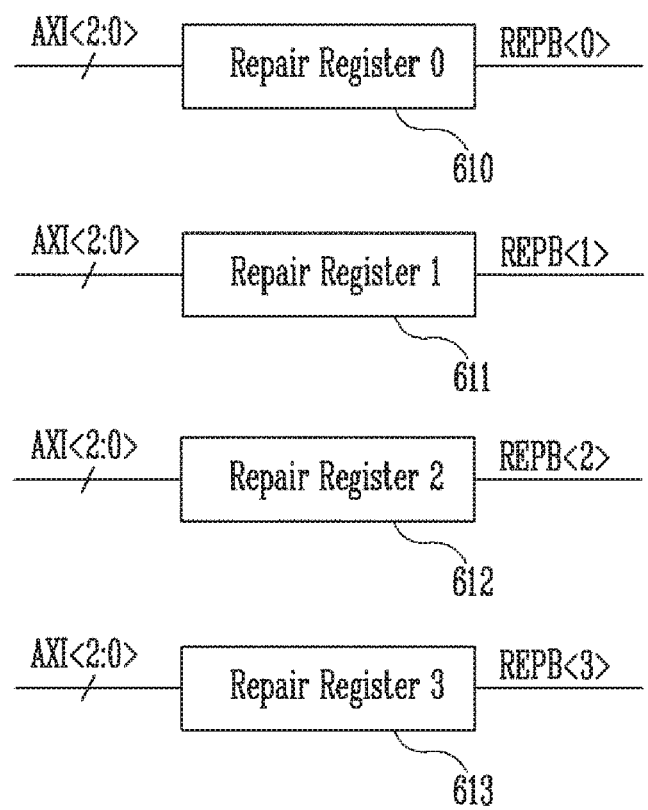
FIG. 20 is a block diagram illustrating a repair register, such as that shown in FIG. 14, in accordance with an embodiment of the present disclosure.

FIG. 20 is a block diagram illustrating a repair register, e.g., the repair register 370 shown in FIG. 14, in accordance with an embodiment of the present disclosure.

Referring to FIG. 20, the repair register 370 includes zeroth to third repair registers 610, 611, 612, and 613.

When the mode control signal CTRL_MODE has a value of 0, the conversion memory area 163 of FIG. 7 may be used as the main memory area. Therefore, only two column select lines CS<9:8> are used as repair lines. Accordingly, when the mode control signal CTRL_MODE has the value of 0, only two repair registers among the four repair registers 610, 611, 612, and 613 included in the repair register 370 of FIG. 14 are used for repairing.

When the mode control signal CTRL_MODE has a value of 1, the conversion memory area 163 may be used as the repair memory area. Therefore, the sixth and seventh column select lines CS<7:6> coupled to the conversion memory area 163 and the eighth and ninth column selection lines CS<9:8> coupled to the repair memory area are all used as repair lines. Accordingly, when the mode control signal CTRL_MODE has a value of 1, the four repair registers 610, 611, 612, and 613 included in the repair register 370 are all used for repairing.

Figure 21:
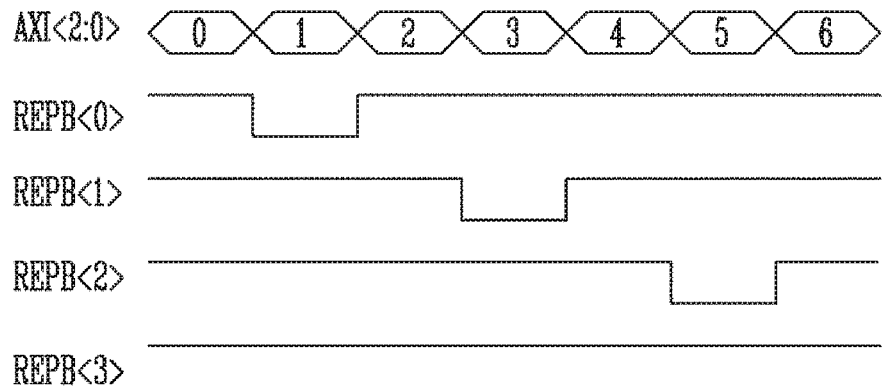
FIG. 21 is a timing diagram illustrating an operation of repairing a main address line according to values stored in repair registers.

FIG. 21 is a timing diagram illustrating an operation of repairing a main address line according to values stored in the repair registers.

The repair operation is described with reference to FIGS. 20 and 21 together.

By way of example, a value of 1 is stored in the zeroth repair register 610 shown in FIG. 20, a value of 3 is stored in the first repair register 611 shown in FIG. 20, and a value of 5 is stored in the second repair register 612 shown in FIG. 20. This means that the first main address line AXI<1> is repaired with a zeroth repair line, the third main address line AXI<3> is repaired with a first repair line, and the fifth main address line AXI<5> is repaired with a second repair line.

A main address signal transferred through the main address lines AXI<2:0> is sequentially increased by 1 from 0 according to a clock period. Each of repair lines REPB<3:0> is enabled to a logic low value when a value stored in a corresponding one of the repair registers 610, 611, 612, and 613 is equal to that represented by the main address signal.

Figure 22:
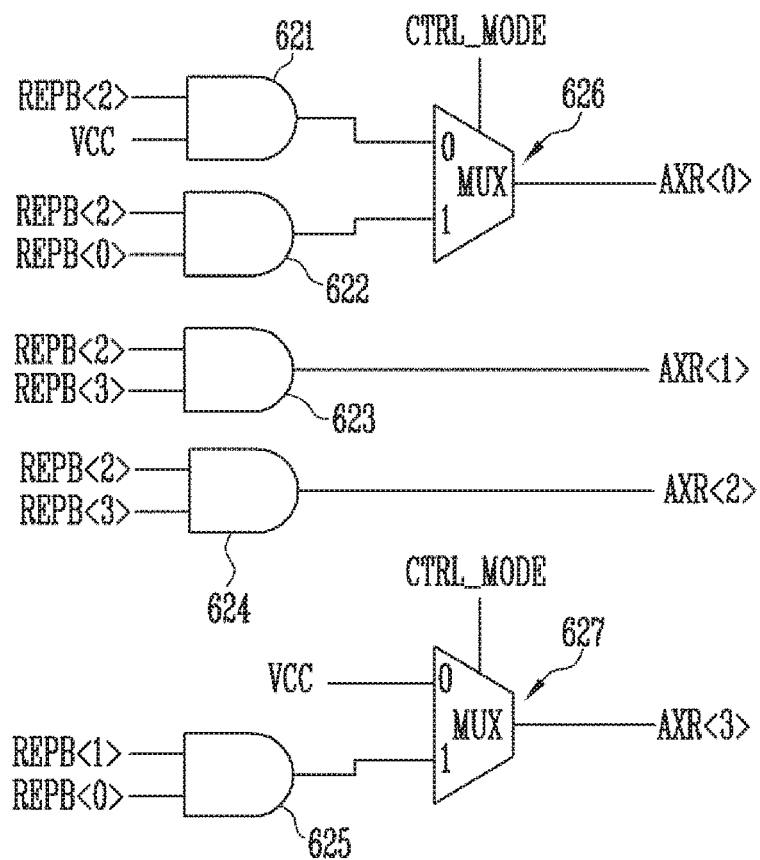
FIG. 22 is a block diagram illustrating a repair address generator, such as that shown in FIG. 14, in accordance with an embodiment of the present disclosure.

FIG. 22 is a block diagram illustrating a repair address generator, e.g., the repair address generator 330 shown in FIG. 14, in accordance with an embodiment of the present disclosure.

Referring to FIG. 22, the repair address generator 330 includes a circuit for generating a repair address signal by encoding a repair signal applied through the repair lines REPB<3:0>. To this end, the repair address generator 330 includes a plurality of AND gates 621, 622, 623, 624, and 625 and multiplexers 626 and 627, which perform an encoding operation shown in the following Table 1. The repair address signal is output through repair address lines AXR<3:0>. In FIG. 22, VCC represents a logic high value (i.e., a value of 1).

TABLE 1

|  | Repair Column | AXR<3:0> CTRL_MODE = 0 | AX<3:0> CTRL_MODE = 1 |
|---|---|---|---|
| Repair Register 0 | Column 1 | — | 6(0110) |
| Repair Register 1 | Column 3 | — | 7(0111) |
| Repair Register 2 | Column 5 | 8(1000) | 8(1000) |
| Repair Register 3 | — | — | — |

According to the circuit shown in FIG. 22, when the mode control signal has a value of 0, only values stored in the second and third repair registers 612 and 613 are used for repairing. When the mode control signal has a value of 1, values stored in the zeroth to third repair registers 610, 611, 612, and 613 are all used for repairing.

An operation of the circuit shown in FIG. 22 is described in more detail as follows. In the example described with reference to FIG. 20, the zeroth repair register 610 stores a value of 1, the first repair register 611 stores a value of 3, the second repair register 612 stores a value of 5, and the third repair register 613 stores no value. When the mode control signal has a value of 0, logic values of the repair register lines REPB<3:0> and the repair address line AXR<3:0> according to values represented by a main address signal of the main address lines AXI<2:0> are shown in the following Table 2. Since the mode control signal has a value of 0, the main address signal of the main address lines AXI<2:0> may have a value from 0 to 7 as described with reference to FIG. 8.

TABLE 2

| AXI<2:0> | 0 | 1 | 2 | 3 | 4 | 5 | 6 | 7 |
|---|---|---|---|---|---|---|---|---|
| REPB<0> | 1 | 0 | 1 | 1 | 1 | 1 | 1 | 1 |
| REPB<1> | 1 | 1 | 1 | 0 | 1 | 1 | 1 | 1 |
| REPB<2> | 1 | 1 | 1 | 1 | 1 | 0 | 1 | 1 |
| REPB<3> | 1 | 1 | 1 | 1 | 1 | 1 | 1 | 1 |
| AXR<0> | 1 | 1 | 1 | 1 | 1 | 0 | 1 | 1 |
| AXR<1> | 1 | 1 | 1 | 1 | 1 | 0 | 1 | 1 |
| AXR<2> | 1 | 1 | 1 | 1 | 1 | 0 | 1 | 1 |
| AXR<3> | 1 | 1 | 1 | 1 | 1 | 1 | 1 | 1 |
| AXR<3:0> | 15(X) | 15(X) | 15(X) | 15(X) | 15(X) | 8(0) | 15(X) | 15(X) |

Figure 23:
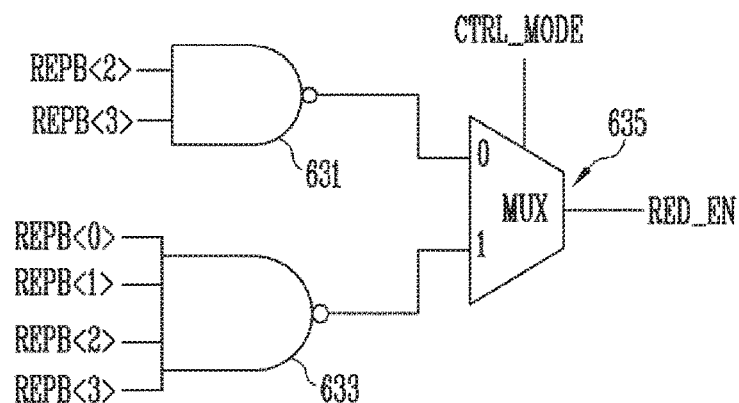
FIG. 23 is a block diagram illustrating a repair enable determiner, such as that shown in FIG. 14, in accordance with an embodiment of the present disclosure.

In Table 2, when the repair address lines AXR<3:0> have a value of 15, the repair enable determiner 390 shown in FIG. 23 disables a repair enable signal RED_EN to a low value. Therefore, in Table 2, only a value of 8 among the repair address lines AXR<3:0> is used in the repair operation.

When the mode control signal has a value of 1, logic values of the repair register lines REPB<3:0> and the repair address line AXR<3:0> according to values represented by the main address signal of the main address lines AXI<2:0> are shown in the following Table 3. Since the mode control signal has a value of 1, the main address signal of the main address lines AXI<2:0> may have a value from 0 to 5 as described with reference to FIG. 8.

TABLE 3

| AXI<2:0> | 0 | 1 | 2 | 3 | 4 | 5 |
|---|---|---|---|---|---|---|
| REPB<0> | 1 | 0 | 1 | 1 | 1 | 1 |
| REPB<1> | 1 | 1 | 1 | 0 | 1 | 1 |
| REPB<2> | 1 | 1 | 1 | 1 | 1 | 0 |
| REPB<3> | 1 | 1 | 1 | 1 | 1 | 1 |
| AXR<0> | 1 | 0 | 1 | 1 | 1 | 0 |
| AXR<1> | 1 | 1 | 1 | 1 | 1 | 0 |
| AXR<2> | 1 | 1 | 1 | 1 | 1 | 0 |
| AXR<3> | 1 | 0 | 1 | 0 | 1 | 1 |
| AXR<3:0> | 15(X) | 6(0) | 15(X) | 7(0) | 15(X) | 8(0) |

Referring to items of the repair address lines AXR<3:0> shown in Table 2 and Table 3, it can be seen that values of zeroth and first repair registers 610 and 611 are not used for repairing when the mode control signal has a value of 0, but used for repairing when the mode control signal has a value of 1.

The circuit shown in FIG. 22 is merely illustrative; various other types of circuits may be used to constitute the repair address generator 330 that performs the operation shown in Table 1.

FIG. 23 is a block diagram illustrating a repair enable determiner, e.g., the repair enable determiner 390 shown in FIG. 14, in accordance with an embodiment of the present disclosure.

Referring to FIG. 23, the repair enable determiner 390 includes two NAND gate 631 and 633 and a multiplexer (MUX) 635.

When the mode control signal has a value of 0, the multiplexer 635 outputs an output of a first NAND gate 631 as the repair enable signal RED_EN. When either of second or third repair register lines REPB<2> and REPB<3> is enabled to a low value, the repair enable signal RED_EN is enabled to a high value.

When the mode control signal has a value of 1, the multiplexer 635 outputs an output of a second NAND gate 633 as the repair enable signal RED_EN. When any one of the zeroth to third repair register lines REPB<0> to REPB<3> is enabled to a low value, the repair enable signal RED_EN is enabled to a high value.

Figure 24:
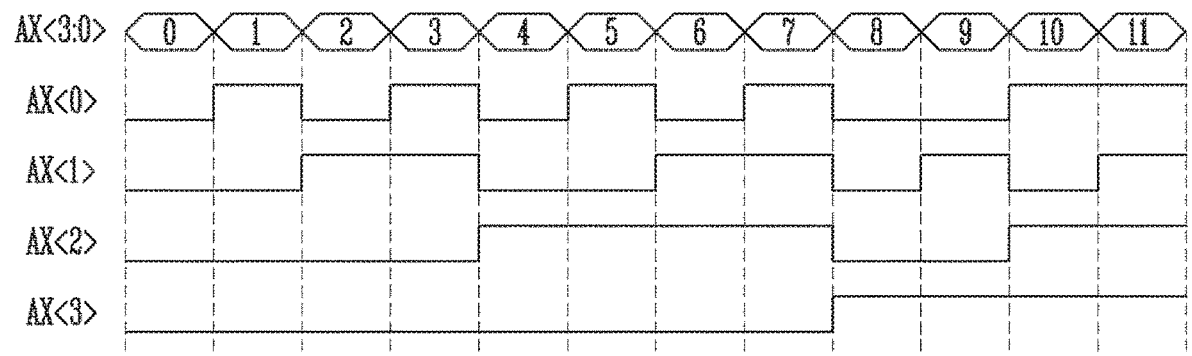
FIG. 24 is a timing diagram illustrating signals represented by address lines.

Referring to FIG. 24 together with Table 2 and FIG. 23, when the mode control signal has a value of 0, a relationship of the main address signal of the main address lines AXI<2:0>, signals of the second and third repair lines REPB<2> and REPB<3>, the repair enable signal RED_EN, a signal of the repair address lines AXR<3:0>, and a signal of the address lines AX<3:0>, which is finally decoded, is shown in Table 4.

TABLE 4

| AXI<2:0> | 0 | 1 | 2 | 3 | 4 | 5 | 6 | 7 |
|---|---|---|---|---|---|---|---|---|
| REPB<2> | 1 | 1 | 1 | 1 | 1 | 0 | 1 | 1 |
| REPB<3> | 1 | 1 | 1 | 1 | 1 | 1 | 1 | 1 |
| RED_EN | 0 | 0 | 0 | 0 | 0 | 1 | 0 | 0 |
| AXR<3:0> | 15(X) | 15(X) | 15(X) | 15(X) | 15(X) | 8(0) | 15(X) | 15(X) |
| AX<3:0> | 0 | 1 | 2 | 3 | 4 | 8 | 6 | 7 |

As shown in Table 4, the signal of the repair address lines AXR<3:0> is used only when the repair enable signal RED_EN is enabled.

Referring to FIG. 24 together with Table 3 and FIG. 23, when the mode control signal has a value of 1, the signal of the main address lines AXI<2:0>, signals of the zeroth to third repair lines REPB<3:0>, the repair enable signal RED_EN, the signal of the repair address lines AXR<3:0>, and the signal of the address lines AX<3:0>, which is finally decoded, is shown in Table 5.

TABLE 5

| AXI<2:0> | 0 | 1 | 2 | 3 | 4 | 5 |
|---|---|---|---|---|---|---|
| REPB<0> | 1 | 0 | 1 | 1 | 1 | 1 |
| REPB<1> | 1 | 1 | 1 | 0 | 1 | 1 |
| REPB<2> | 1 | 1 | 1 | 1 | 1 | 0 |
| REPB<3> | 1 | 1 | 1 | 1 | 1 | 1 |
| RED_EN | 0 | 1 | 0 | 1 | 0 | 1 |
| AXR<3:0> | 15(X) | 6(0) | 15(X) | 7(0) | 15(X) | 8(0) |
| AX<3:0> | 0 | 6 | 2 | 7 | 4 | 8 |

FIG. 24 is a timing diagram illustrating signals represented by the address lines.

Referring to FIG. 24, a value of a signal represented by the address line AX<3:0> and an output value of each address line according thereto are illustrated. When an address signal has a value of 0, the zeroth to third address lines AX<0> to AX<3> may all transfer a low value. When the address signal has a value of 1, the zeroth address line AX<0> may transfer a value of 1, and the first to third address lines AX<1> to AX<3> may all transfer a logic low value (i.e., a value of 0). In this manner, a relationship of output values of the address lines AX<0> to AX<3> and the address signal may be represented.

Figure 25:
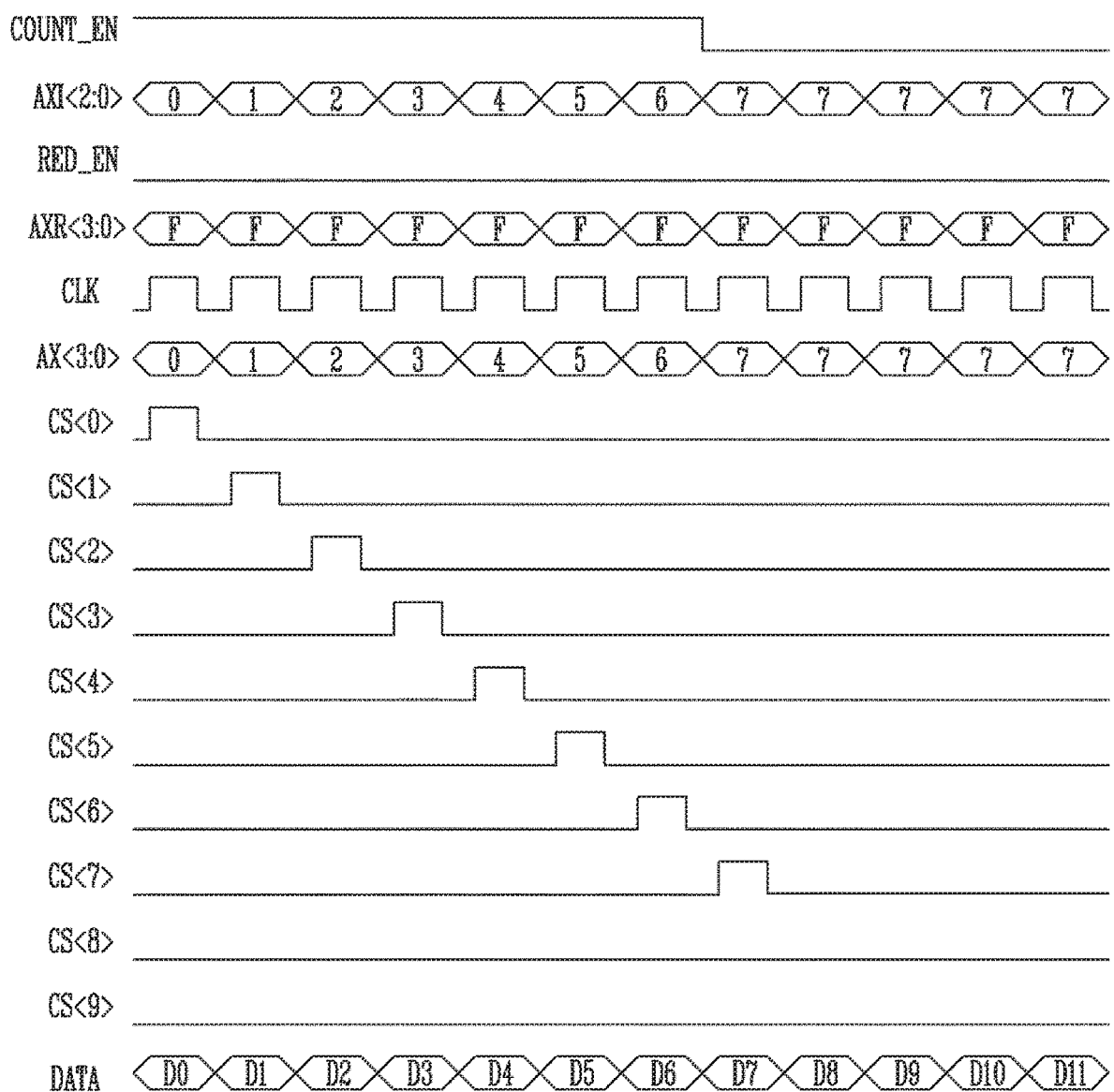
FIG. 25 is a timing diagram illustrating a case in which a mode control signal has a value of '0' and a semiconductor memory device does not perform a repair operation.

FIG. 25 is a timing diagram illustrating a case where a mode control signal has a value of 0, and a semiconductor memory device does not perform a repair operation. For example, in the example shown in FIG. 25, any value is not stored in the repair registers. For example, FIG. 25 illustrates a count enable signal COUNT_EN, a main address signal transferred to a main address lines AXI<2:0>, a repair enable signal RED_EN, a repair address signal transferred to a repair address lines AXR<3:0>, a clock signal CLK, an address signal transferred to a address lines AX<3:0>, a column select signal transferred to zeroth to ninth column select lines CS<0> to CS<9>, and a data signal DATA. The data signal DATA may include 1 byte, i.e., 8 bits per one clock period.

Since the mode control signal has a value of 0, the count enable signal COUNT_EN may be inactivated to a logic low value when the main address signal transferred to the main address lines AXI<2:0> represents a value of 7 as described with reference to FIGS. 17 to 19. The count enable signal COUNT_EN may maintain a logic high value in an activation state while the main address signal is representing values of 0 to 6.

Since the repair operation is not performed, the repair enable signal RED_EN maintains a logic low value in an inactivation state. Accordingly, the repair address lines AXR<3:0> may not have any value.

Since the repair enable signal RED_EN maintains the inactivation state, the address signal transferred to the address lines AX<3:0> may have the same value as the main address signal transferred to the main address lines AXI<2:0>.

Accordingly, when the address signal transferred to the address lines AX<3:0> has a value of 0, the zeroth column select signal is activated such that zeroth data D0 is stored in cache latches coupled to the zeroth column select line CS<0>.

When the address signal transferred to the address lines AX<3:0> has a value of 1, the first column select signal is activated such that first data D1 is stored in cache latches coupled to the first column select line CS<1>.

In this manner, seventh data D7 is stored in cache latches coupled to the seventh column select line CS<7>. Subsequently, eighth to eleventh data D8 to D11 may not be stored in cache latches. Alternatively, after the zeroth to seventh data D0 to D7 stored in the cache latches are processed, the eighth to eleventh data D8 to D11 may be stored in the cache latches.

Figure 26:
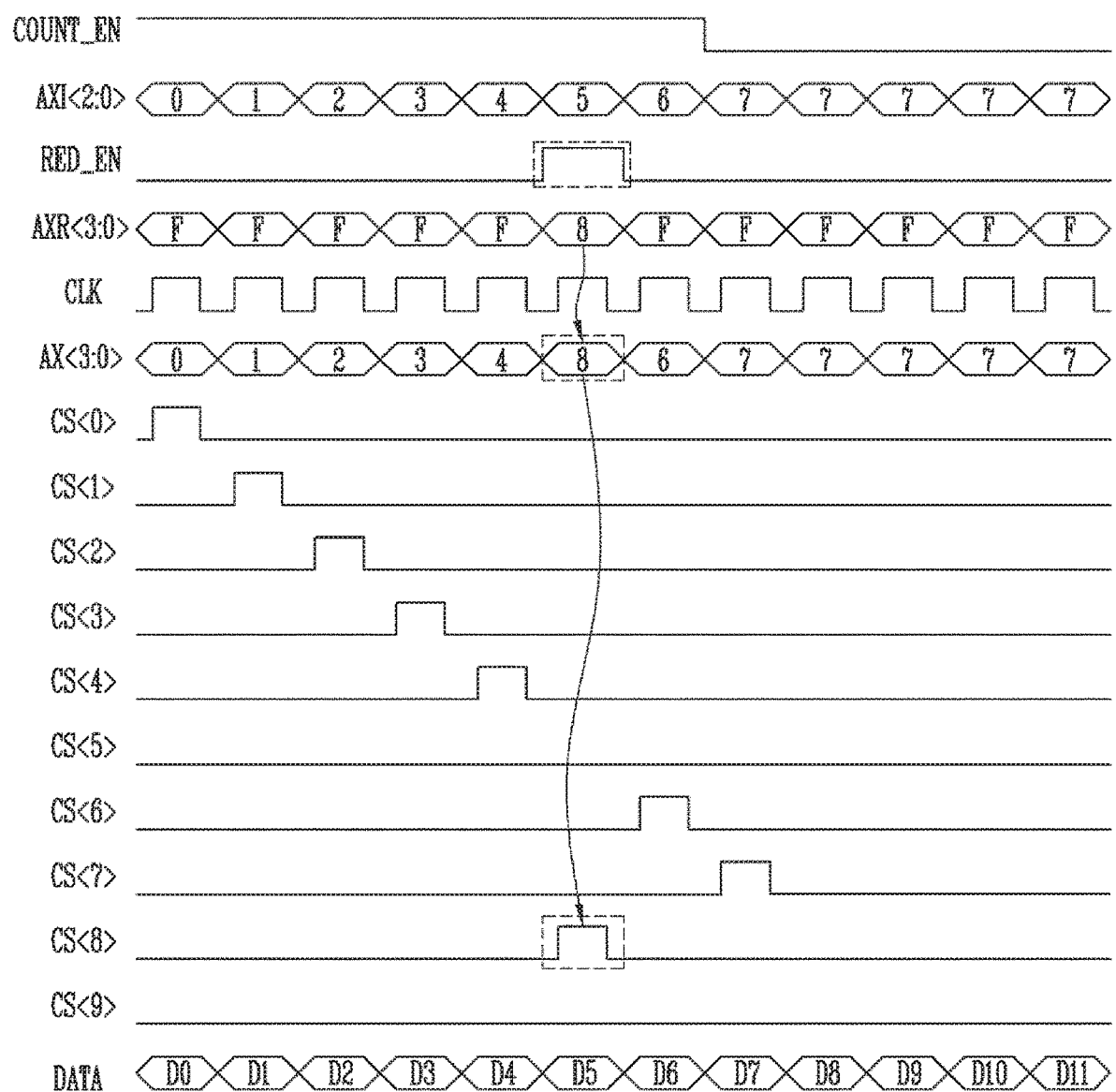
FIG. 26 is a timing diagram illustrating a case in which a mode control signal has a value of '0' and a semiconductor memory device performs a repair operation.

FIG. 26 is a timing diagram illustrating a case where A mode control signal has a value of 0, and a semiconductor memory device performs a repair operation. For example, FIG. 26 illustrates the repair operation when a value of 1 is stored in the zeroth repair register 610 of FIG. 20, a value of 3 is stored in the first repair register 611, a value of 5 is stored in the second repair register 612, and any value is not stored in the third repair register 613.

Since the mode control signal has a value of 0, the count enable signal COUNT_EN may be inactivated to a logic low value when the main address signal transferred to the main address lines AXI<2:0> represents a value of 7 as described with reference to FIGS. 17 to 19. The count enable signal COUNT_EN may maintain a logic high value in an activation state while the main address signal is representing values of 0 to 6.

Since the repair operation is performed, the repair enable signal RED_EN is activated when the main address signal transferred through the main address lines AXI<2:0> has a value equal to that stored in the second repair register 612 or the third repair register 613. In the above-described example, it is assumed a case where a value of 5 is stored in the second repair register 612 and any value is not stored in the third repair register 613. Therefore, the repair enable signal RED_EN is activated when the main address signal has a value of 5.

When the repair enable signal RED_EN is activated, a repair address signal is transferred through the repair address lines AXR<3:0>. The repair address signal has a value representing a column select line indicated by a corresponding repair register as described with reference to FIG. 22 and Table 1.

More specifically, in FIG. 26, when the main address signal has a value of 5, the repair enable signal RED_EN is activated. Accordingly, the repair address signal has a value of 8 representing a column select line indicated by the second repair register 612. Since the repair enable signal RED_EN is activated, the multiplexer 350 of FIG. 14 transfers the repair address signal to the address lines AX<3:0>. Accordingly, the address signal also has a value of 8. The eighth column select line CS<8> instead of the fifth column select line CS<5> is activated, and fifth data D5 is stored in cache latches coupled to the eighth column select line CS<8>, i.e., cache latches of the repair memory area 165.

Subsequently, when the main address signal becomes a value of 6, the repair enable signal is inactivated. Accordingly, the multiplexer 350 of FIG. 14 transfers the main address signal to the address lines AX<3:0>, and the address signal has a value of 6. Sixth data D6 is stored in cache latches coupled to the sixth column select line CS<6>, i.e., cache latches of the main memory area 161.

An operation at a subsequent time is identical to that shown in FIG. 25. The operation shown in FIG. 26 is substantially identical to that described through the above-described Table 4.

Referring to FIGS. 25 and 26, when the mode control signal CTRL_MODE has a value of 0, the sixth and seventh column select lines CS<6> and CS<7> coupled to the cache latches of the conversion memory area 163 are operated identically to the zeroth to fifth column select lines CS<0> to CS<5> coupled to the cache latches of the main memory area 161. Therefore, when the mode control signal CTRL_MODE has a value of 0, the conversion memory area 163 of the cache buffer 160 may operate as the main memory area 161.

Figure 27:
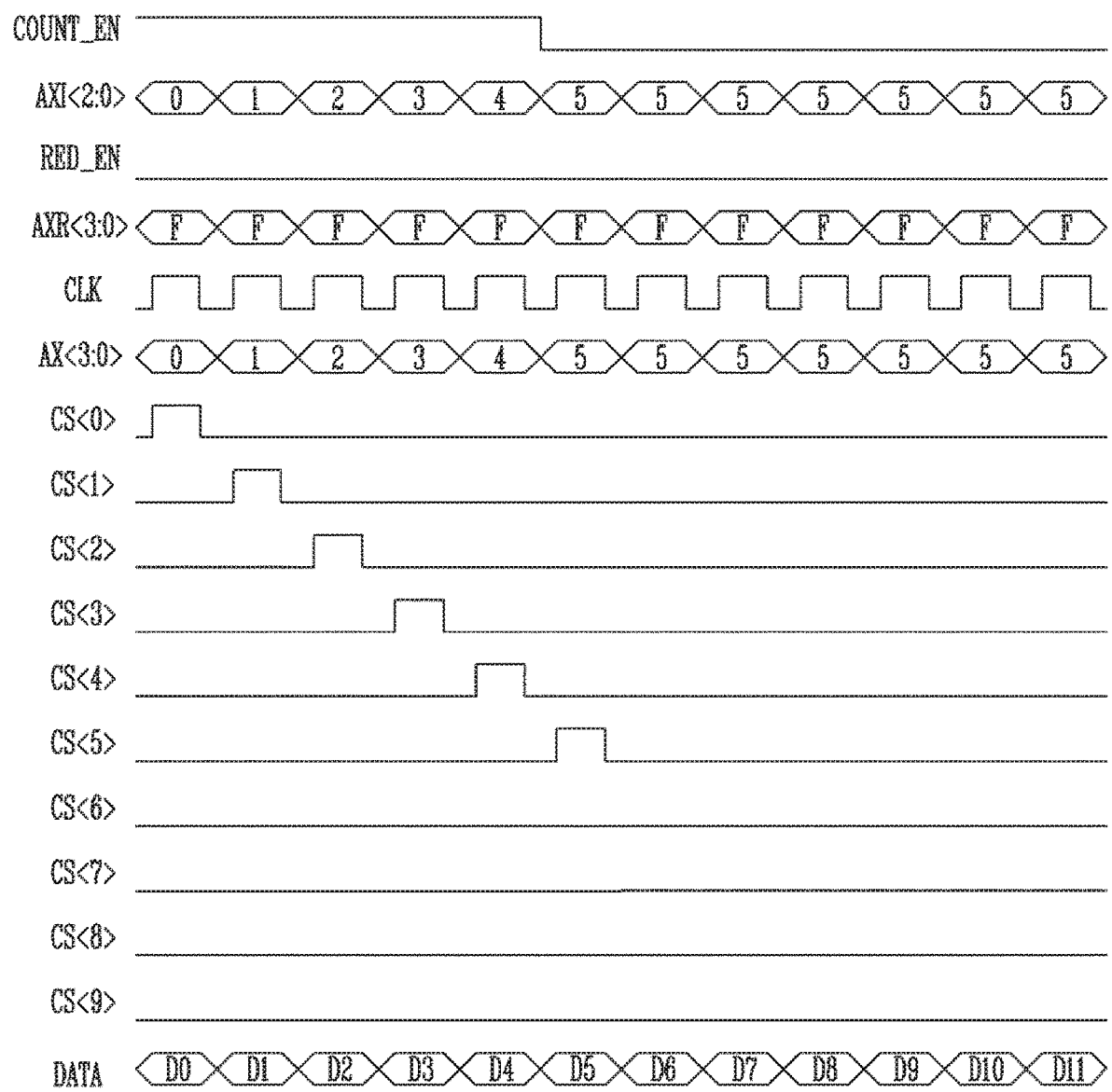
FIG. 27 is a timing diagram illustrating a case in which a mode control signal has a value of '1' and a semiconductor memory device does not perform a repair operation.

FIG. 27 is a timing diagram illustrating a case where a mode control signal has a value of 1, and a semiconductor memory device does not perform a repair operation. For example, in the example shown in FIG. 27, any value is not stored in the repair registers.

Since the mode control signal has a value of 1, the count enable signal COUNT_EN may be inactivated to a logic low value when the main address signal transferred to the main address lines AXI<2:0> represents a value of 5 as described with reference to FIGS. 17 to 19. The count enable signal COUNT_EN may maintain a logic high value in an activation state while the main address signal is representing values of 0 to 4.

Since the repair operation is not performed, the repair enable signal RED_EN maintains a logic low value in an inactivation state. Accordingly, the repair address lines AXR<3:0> may not have any value.

Since the read enable signal RED_EN maintains the inactivation state, the address signal transferred to the address lines AX<3:0> may have the same value as the main address signal transferred to the main address lines AXI<2:0>.

Accordingly, when the address signal transferred to the address lines AX<3:0> has a value of 0, the zeroth column select signal is activated such that the zeroth data D0 is stored in cache latches coupled to the zeroth column select line CS<0>.

When the address signal transferred to the address lines AX<3:0> has a value of 1, the first column select signal is activated such that the first data D1 is stored in cache latches coupled to the first column select line CS<1>.

In this manner, the fifth data D5 is stored in cache latches coupled to the fifth column select line CS<5>. Subsequently, sixth to eleventh data D6 to D11 may not be stored in cache latches. Alternatively, after the zeroth to fifth data D0 to D5 stored in the cache latches are processed, the sixth to eleventh data D6 to D11 may be stored in the cache latches.

Figure 28:
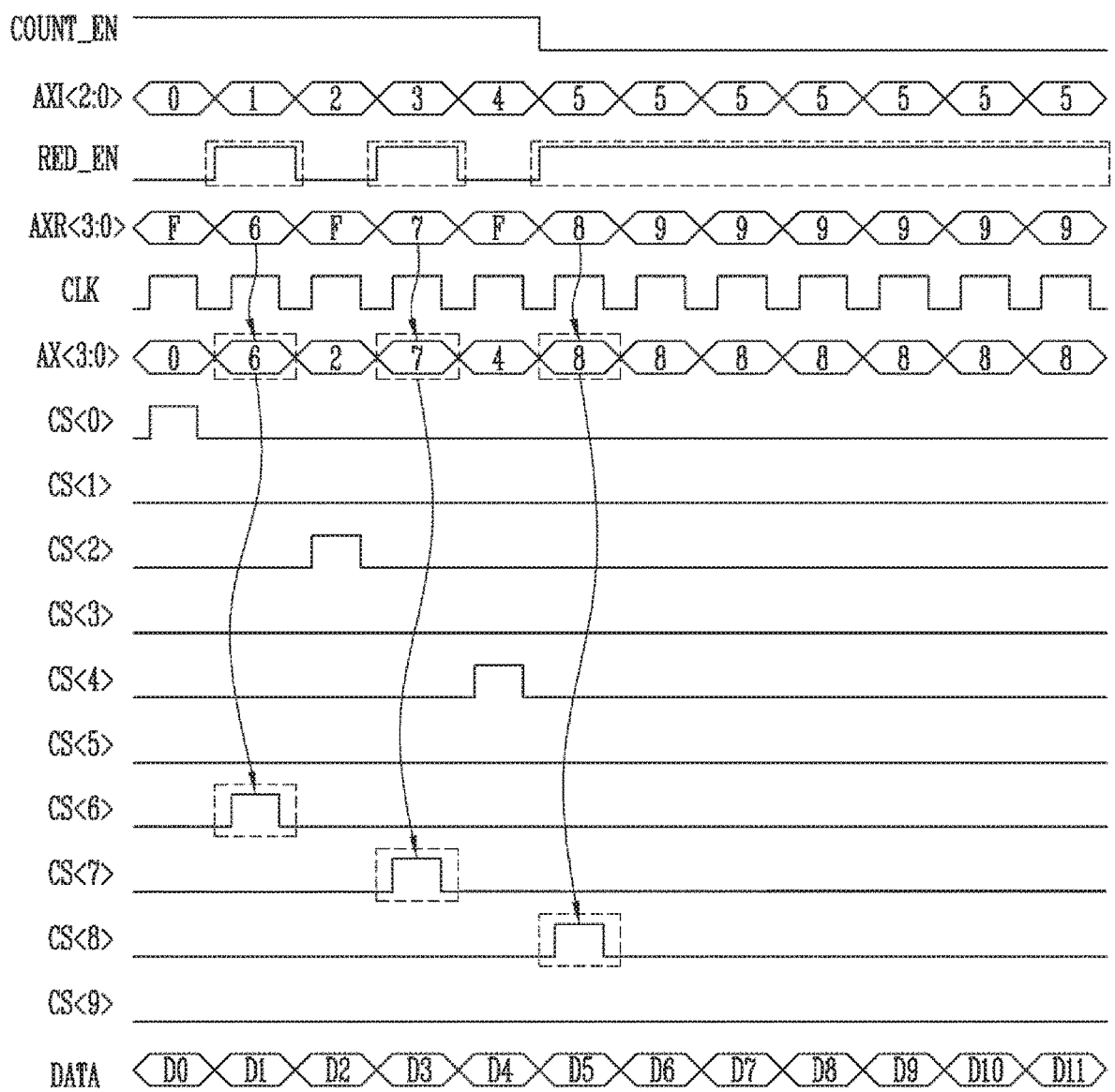
FIG. 28 is a timing diagram illustrating a case in which a mode control signal has a value of '1' and a semiconductor memory device performs a repair operation.

FIG. 28 is a timing diagram illustrating a case where a mode control signal has a value of 1, and a semiconductor memory device performs a repair operation. For example, FIG. 28 illustrates the repair operation when a value of 1 is stored in the zeroth repair register 610 of FIG. 20, a value of 3 is stored in the first repair register 611, a value of 5 is stored in the second repair register 612, and any value is not stored in the third repair register 613.

Since the mode control signal has a value of 1, the count enable signal COUNT_EN may be inactivated to a logic low value when the main address signal transferred to the main address lines AXI<2:0> represents a value of 5 as described with reference to FIGS. 17 to 19. The count enable signal COUNT_EN may maintain a logic high value in an activation state while the main address signal is representing values of 0 to 4.

Since the repair operation is performed, the repair enable signal RED_EN is activated when the main repair signal transferred through the main repair lines AXI<2:0> has a value equal to that stored in the zeroth to third repair registers 610 to 613. That is, the repair enable signal RED_EN is activated when the main address signal becomes 1, 3, and 5.

When the repair enable signal RED_EN is activated, a repair address signal is transferred through the repair address lines AXR<3:0>. The repair address signal has a value representing a column select line indicated by a corresponding repair register as described with reference to FIG. 22 and Table 1.

More specifically, in FIG. 28, when the main address signal has a value of 1, the repair enable signal RED_EN is activated. Accordingly, the repair address signal has a value of 6 representing a column select line indicated by the zeroth repair register 610. Since the repair enable signal RED_EN is activated, the multiplexer 350 of FIG. 14 transfers the repair address signal to the address lines AX<3:0>. Accordingly, the address signal also has a value of 6. The sixth column select line CS<6> instead of the first column select line CS<1> is activated, and the first data D1 is stored in cache latches coupled to the sixth column select line CS<6>, i.e., cache latches of the conversion memory area 163.

Subsequently, when the main address signal becomes a value of 2, the repair enable signal RED_EN is inactivated. Accordingly, the multiplexer 350 of FIG. 14 transfers the main address signal to the address lines AX<3:0>, and the address signal has a value of 2. Second data D2 is stored in cache latches coupled to the second column select line CS<2>, i.e., cache latches of the main memory area 161.

Subsequently, when the main address signal has a value of 3, the repair enable signal RED_EN is activated such that the repair address signal is transferred to the address lines AX<3:0>. Therefore, the address signal has a value of 7.

Subsequently, when the main address signal has a value of 4, the repair enable signal RED_EN is inactivated. Accordingly, the multiplexer 350 of FIG. 14 transfers the main address signal to the address lines AX<3:0>, and the address signal has a value of 4.

Subsequently, when the main address signal has a value of 5, the repair enable signal RED_EN is activated such that the repair address signal is transferred to the address lines AX<3:0>. Therefore, the address signal has a value of 8. When the main address signal has a value of 5, the count enable signal EN is inactivated. The operation of FIG. 28 is substantially identical to that described through the above-described Table 5.

Referring to FIGS. 27 and 28, the sixth and seventh column select lines CS<6> and CS<7> coupled to the cache latches of the conversion memory area 163 are operated identically to the eighth and ninth column select lines CS<8> and CS<9> coupled to the cache latches of the repair memory area 165. Therefore, when the mode control signal has a value of 1, the conversion memory area 163 of the cache buffer 160 may operate as the repair memory area 165.

As described above, the cache buffer 160 of the semiconductor memory device 100 includes the main memory area 161, the conversion memory area 163, and the repair memory area 165. The decoding circuit 170 of the semiconductor memory device 100 controls the conversion memory area 163 to operate as either of the main memory area 161 or the repair memory area 165, based on the mode control signal CTRL_MODE. Accordingly, the cache buffer 160 and the memory cell array 110 of the semiconductor memory device 100 may be more efficiently used.

Figure 29:
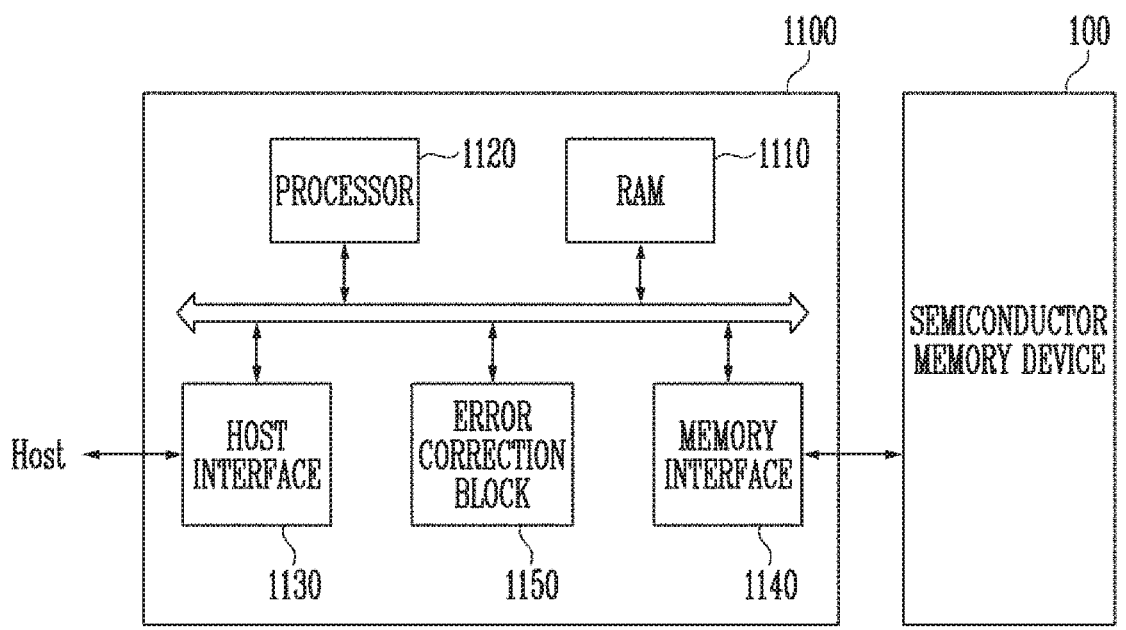
FIG. 29 is a block diagram illustrating a memory system including a semiconductor memory device, such as that shown in FIG. 2, in accordance with an embodiment of the present disclosure.

FIG. 29 is a block diagram illustrating a memory system 1000 including a semiconductor memory device, e.g., the semiconductor memory device 100 shown in FIG. 2, in accordance with an embodiment of the present disclosure.

Referring to FIG. 29, the memory system 1000 includes the semiconductor memory device 100 and a controller 1100.

The semiconductor memory device 100 may be configured and operated as described with reference to FIGS. 1 to 28.

The controller 1100 is coupled to a host and the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host. The controller 1100 is configured to drive firmware for controlling the semiconductor memory device 100.

The controller 1100 includes a random access memory (RAM) 1110, a processor 1120, a host interface 1130, a memory interface 1140, and an error correction block 1150. The RAM 1110 is used as at least one of a working memory of the processor 1120, a cache memory between the semiconductor memory device 100 and the host, and a buffer memory between the semiconductor memory device 100 and the host. The processor 1120 controls overall operations of the controller 1100.

The host interface 1130 includes a protocol for exchanging data between the host and the controller 1100. In an embodiment, the controller 1100 is configured to communicate with the host through at least one of various interface protocols, such as a Universal Serial Bus (USB) protocol, a Multi-Media Card (MMC) protocol, a Peripheral Component Interconnection (PCI) protocol, a PCI-Express (PCI-e or PCIe) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC).

The controller 1100 and the semiconductor memory device 100 may be integrated into one semiconductor device. In an embodiment, the controller 1100 and the semiconductor memory device 100 may be integrated into one semiconductor device to constitute a memory card, such as a PC card (e.g., a Personal Computer Memory Card International Association (PCMCIA) card), a Compact Flash (CF) card, a Smart Media Card (e.g., SM or SMC), a memory stick, a Multi-Media Card (e.g., MMC, RS-MMC or MMCmicro), a secure digital (SD) Card (e.g., SD, miniSD, microSD or SDHC), or a Universal Flash Storage (UFS).

The controller 1100 and the semiconductor memory device 100 may be integrated into one semiconductor device to constitute a semiconductor drive (e.g., a solid state drive (SSD)). The semiconductor drive SSD includes a storage device configured to store data in a semiconductor memory. If the memory system 1000 is used as the semiconductor drive SSD, the operating speed of the host coupled to the memory system 1000 may be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 30:
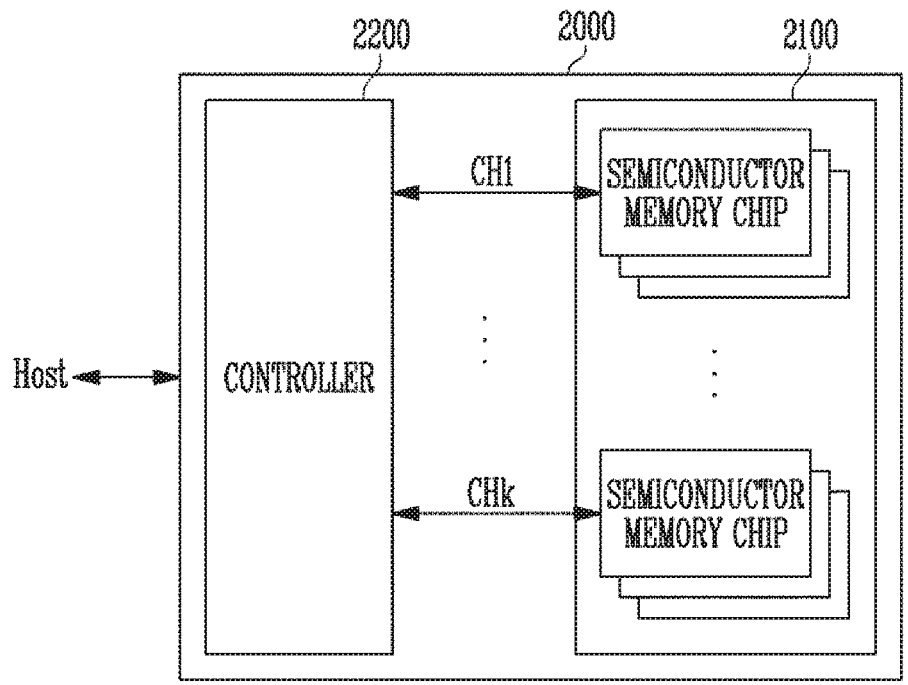
FIG. 30 is a block diagram illustrating an application of a memory system, such as that shown in FIG. 29, in accordance with an embodiment of the present disclosure.

FIG. 30 is a block diagram illustrating an application example of a memory system, e.g., the memory system 1000 shown in FIG. 29, in accordance with an embodiment of the present disclosure.

Referring to FIG. 30, the memory system 2000 includes a semiconductor memory device 2100 and a controller 2200. The semiconductor memory device 2100 includes a plurality of semiconductor memory chips. The plurality of semiconductor memory chips are divided into a plurality of groups.

For example, FIG. 30 illustrates that the plurality of groups communicates with the controller 2200 through first to kth channels CH1 to CHk. Each semiconductor memory chip may be configured and operated identically to the semiconductor memory device 100 described with reference to FIG. 2.

Each group is configured to communicate with the controller 2200 through one common channel. The controller 2200 is configured identically to the controller 1100 described with reference to FIG. 29. The controller 2200 is configured to control the plurality of memory chips of the semiconductor memory device 2100 through the plurality of channels CH1 to CHk.

In FIG. 30, a case where a plurality of semiconductor memory chips are coupled to one channel is described. However, it will be understood that the memory system 2000 may be modified such that one semiconductor memory chip is coupled to one channel.

Figure 31:
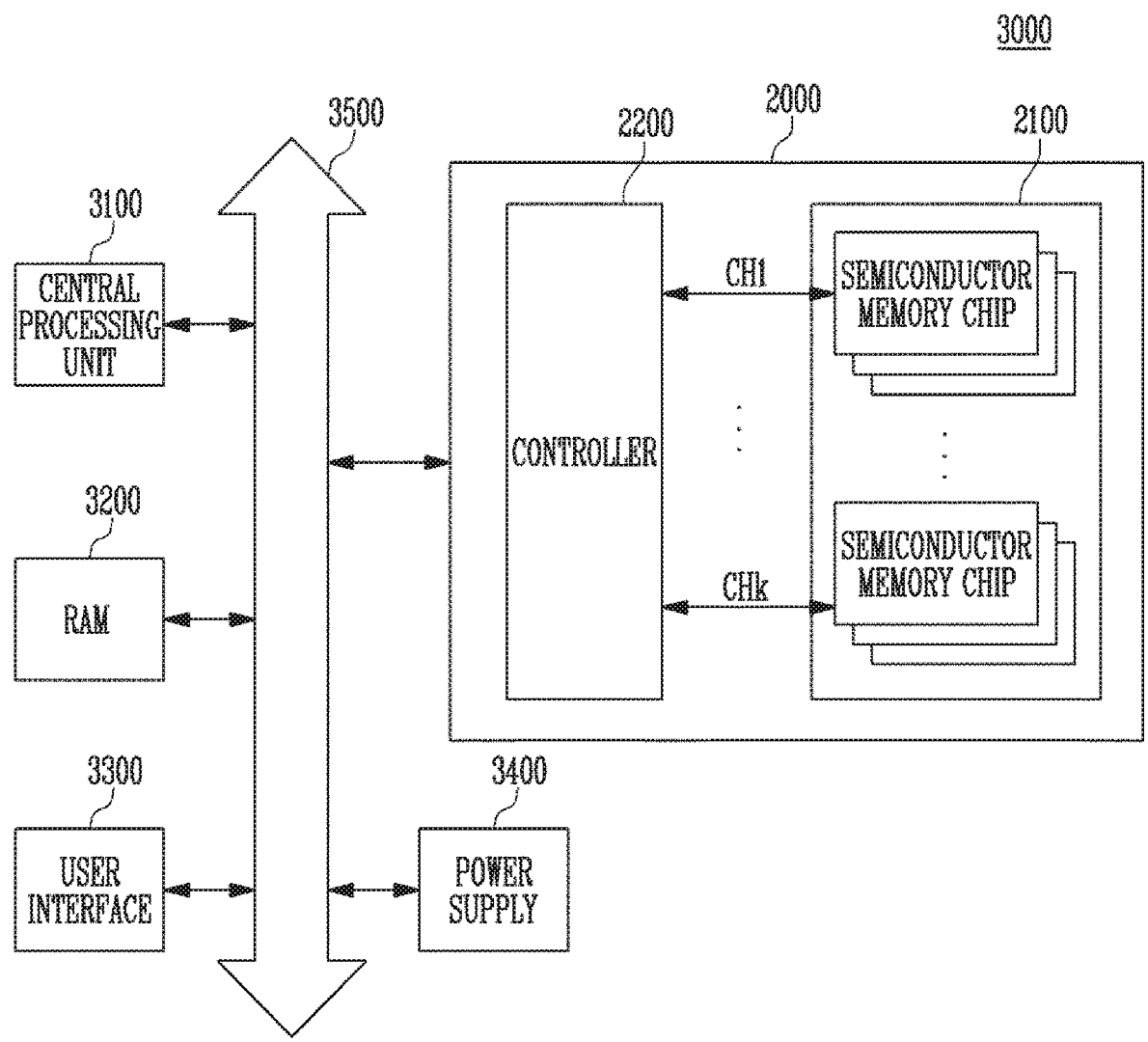
FIG. 31 is a block diagram illustrating a computing system including a memory system in accordance with an embodiment of the present disclosure.

FIG. 31 is a block diagram illustrating a computing system 3000 including the memory system 2000 described with reference to FIG. 30, in accordance with an embodiment of the present disclosure.

Referring to FIG. 31, the computing system 3000 includes a central processing unit (CPU) 3100, a random access memory (RAM) 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data supplied through user interface 3300 or data processed by the CPU 3100 are stored in the memory system 2000.

For example, FIG. 31 illustrates that the semiconductor memory device 2100 is coupled to the system bus 3500 through the controller 2200. However, the semiconductor memory device 2100 may be directly coupled to the system bus 3500. The function of the controller 2200 may be performed by the CPU 3100 and the RAM 3200.

For example, FIG. 31 illustrates that the memory system 2000 described with reference to FIG. 30 is provided. However, the memory system 2000 may be replaced by the memory system 1000 described with reference to FIG. 29. In an embodiment, the computing system 3000 may be configured to include both of the memory systems 1000 and 2000 described with reference to FIGS. 29 and 30.

In accordance with embodiments of the present disclosure, a decoding circuit capable of flexibly using a partial area of a cache buffer and a semiconductor memory device having the decoding circuit are provided.

While the present disclosure has been shown and described with reference to certain embodiments thereof, it will be understood by those skilled in the art in light of the present disclosure that various changes in form and details may be made therein without departing from the spirit and scope of the present invention as defined by the appended claims and their equivalents. Therefore, the scope of the present invention should not be limited to the above-described embodiments but should be determined by the appended claims and their equivalents.

In the above-described embodiments, steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present invention is not limited thereto. That is, it should be apparent to those skilled in the art that various modifications can be made on the basis of the technological scope of the present disclosure.

Although specific terminologies are used here, they are only to explain the embodiments of the present disclosure. Therefore, the present invention is not restricted to the above-described embodiments, as many variations are possible within the spirit and scope of the present disclosure, all of which are encompassed by the present invention to the extent they fall within the scope of the claims.

What is claimed is:

1. A semiconductor memory device comprising:
   a memory cell array including a plurality of memory cells;
   a buffer coupled to the memory cell array, including a first memory area, a second memory area, and a conversion memory area;
   control logic configured to output a mode control signal representing an operating mode of the buffer; and
   a decoding circuit coupled to the buffer and configured to:
      receive the mode control signal;
      control operating of the buffer to use the first memory area and the conversion memory area as a main memory area and the second memory area as a repair memory area when the mode control signal indicates a first mode; and
      control operating of the buffer to use the first memory area as the main memory area and the second memory area and the conversion memory area as the repair memory area when the mode control signal indicates a second mode.

2. The semiconductor memory device of claim 1, wherein the decoding circuit includes:
   a column address generator configured to generate an address signal, based on the mode control signal; and
   a column decoder coupled to the buffer through column select lines, and configured to decode the column select lines, based on the address signal.

3. The semiconductor memory device of claim 2, wherein the column select lines include first column select lines coupled to the first memory area, second column select lines coupled to the second memory area, and conversion column select lines coupled to the conversion memory area.

4. The semiconductor memory device of claim 3, wherein the column decoder includes:
   a signal inverter configured to generate an inverting address signal by inverting the address signal;
   a select signal generator configured to generate a select signal by decoding the address signal and the inverting address signal; and
   a clock synchronizer configured to generate a column select signal for selecting the column select lines by synchronizing the select signal with a clock signal.

5. The semiconductor memory device of claim 3, wherein the column address generator includes:

a main address generator configured to generate a main address signal sequentially increased according to a clock signal;
a repair register configured to store repair information;
a repair address generator configured to generate a repair address signal, based on the repair information;
a repair enable determiner configured to generate a repair enable signal, based on the repair information; and
a multiplexer configured to output one of the main address signal and the repair address signal as the address signal, based on the repair enable signal.

6. The semiconductor memory device of claim 5, wherein the main address generator includes:
a count enable signal generator configured to generate a count enable signal for determining an end value of the main address signal, based on the mode control signal; and
a column counter configured to generate the main address signal sequentially increased from an initial value to the end value, based on the count enable signal.

7. The semiconductor memory device of claim 6, wherein the count enable signal generator includes:
a count end control signal generator configured to generate a count reference signal by selecting one of a first count value and a second count value, based on the mode control signal; and
a logical product operator configured to generate the count enable signal by performing a logical product operation on a bit value included in the count reference signal.

8. The semiconductor memory device of claim 7, wherein the buffer includes a page buffer.

9. The semiconductor memory device of claim 7, wherein the buffer includes a cache buffer.

10. A decoding circuit comprising:
a column decoder coupled to column selection lines including main column select lines, conversion column select lines, and repair column select lines, to select a column select line corresponding to an address signal; and
a column address generator configured to generate the address signal such that a conversion memory area coupled to the conversion column select lines operates as one of a main memory area and a repair memory area, based on a mode control signal,
wherein the column address generator includes:
a main address generator configured to generate a main address signal sequentially increased according to a clock signal;
a repair address generator configured to generate a repair address signal, based on repair information;
a repair enable determiner configured to generate a repair enable signal, based on the repair information; and
a multiplexer configured to output one of the main address signal and the repair address signal as the address signal, based on the repair enable signal.

11. The decoding circuit of claim 10, wherein, when the mode control signal indicates a first mode,
the main address generator generates the main address signal for selecting the main column select lines and the conversion column select lines, and
the repair address generator generates the repair address signal for selecting the repair column select lines.

12. The decoding circuit of claim 10, wherein, when the mode control signal indicates a second mode,
the main address generator generates the main address signal for selecting the main column select lines, and
the repair address generator generates the repair address signal for selecting the conversion column select lines and the repair column select lines.

13. The decoding circuit of claim 10, wherein the main address generator includes:
a count enable signal generator configured to generate a count enable signal for determining an end value of the main address signal, based on the mode control signal; and
a column counter configured to generate the main address signal sequentially increased from an initial value to the end value, based on the count enable signal.

14. The decoding circuit of claim 13, wherein the count enable signal generator includes:
a count end control signal generator configured to generate a count reference signal by selecting one of a first count value and a second count value, based on the mode control signal; and
a logical product operator configured to generate the count enable signal by performing a logical product operation on a bit value included in the count reference signal.

15. A semiconductor memory device comprising:
a memory cell array;
a plurality of latches coupled to the memory cell array, the plurality of latches including a first subset of latches, a second subset of latches and a third subset of latches;
control logic configured to output a mode control signal indicating operation of the semiconductor memory device in one of a normal mode and a test mode; and
a decoding circuit coupled to the plurality of latches and configured to
receive the mode control signal,
employ the first subset of latches and the second subset of latches as main latches and the third subset of latches as repair latches when the mode control signal indicates the normal mode, and
employ the first subset of latches as the main latches and the second subset of latches and the third subset of latches as the repair latches when the mode control signal indicates the test mode.

* * * * *